(12) United States Patent
Lee

(10) Patent No.: US 8,335,107 B2
(45) Date of Patent: Dec. 18, 2012

(54) SEMICONDUCTOR MEMORY DEVICE AND METHOD OF OPERATING THE SAME

(75) Inventor: Jin Haeng Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 173 days.

(21) Appl. No.: 12/971,208

(22) Filed: Dec. 17, 2010

(65) Prior Publication Data

US 2011/0149652 A1    Jun. 23, 2011

(30) Foreign Application Priority Data

Dec. 17, 2009  (KR) .................. 10-2009-0125987

(51) Int. Cl.
*G11C 16/00*    (2006.01)
(52) U.S. Cl. .......... 365/185.11; 365/185.03; 365/185.22
(58) Field of Classification Search .............. 365/185.02
See application file for complete search history.

(56) References Cited

U.S. PATENT DOCUMENTS

| | | | |
|---|---|---|---|
| 6,671,204 B2 * | 12/2003 | Im | 365/185.12 |
| 7,042,770 B2 * | 5/2006 | Lee et al. | 365/189.05 |
| 7,336,543 B2 * | 2/2008 | Chen et al. | 365/189.05 |
| 7,813,186 B2 * | 10/2010 | Park et al. | 365/189.02 |
| 8,189,392 B2 * | 5/2012 | Park | 365/185.21 |
| 8,189,394 B2 * | 5/2012 | Jin et al. | 365/185.22 |
| 8,238,163 B2 * | 8/2012 | Park | 365/185.22 |

FOREIGN PATENT DOCUMENTS

KR    100816155    3/2008

OTHER PUBLICATIONS

Notice of Preliminary Rejection issued from Korean Intellectual Property Office on Sep. 18, 2011.
Changhyuk Lee et al., "A 32Gb MLC NAND-Flash Memory with Vth-Endurance-Enhancing Schemes in 32nm CMOS,".

* cited by examiner

*Primary Examiner* — Tan T. Nguyen
(74) *Attorney, Agent, or Firm* — IP & T Group LLP

(57) ABSTRACT

A semiconductor memory device comprises memory blocks having a plurality of memory cells coupled to a plurality of bit lines, a first latch group coupled to a sense node and configured to store data to be programmed into memory cells, where the memory cells are coupled to the bit lines and the sense node is coupled to at least one of the bit lines, a second latch group coupled to the sense node and configured to receive data of the first latch group, and a sense node voltage control circuit configured to control a voltage of the sense node according to data stored in the first latch group.

33 Claims, 12 Drawing Sheets

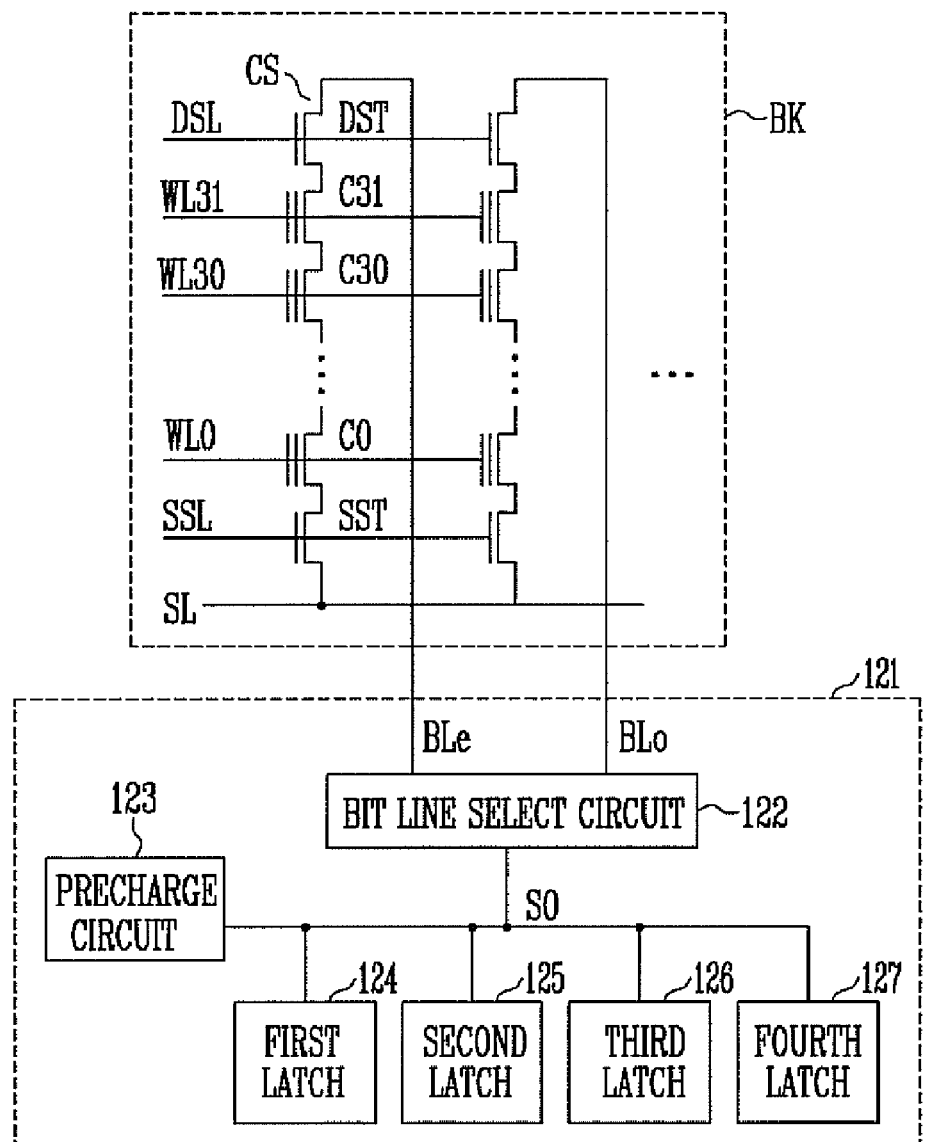

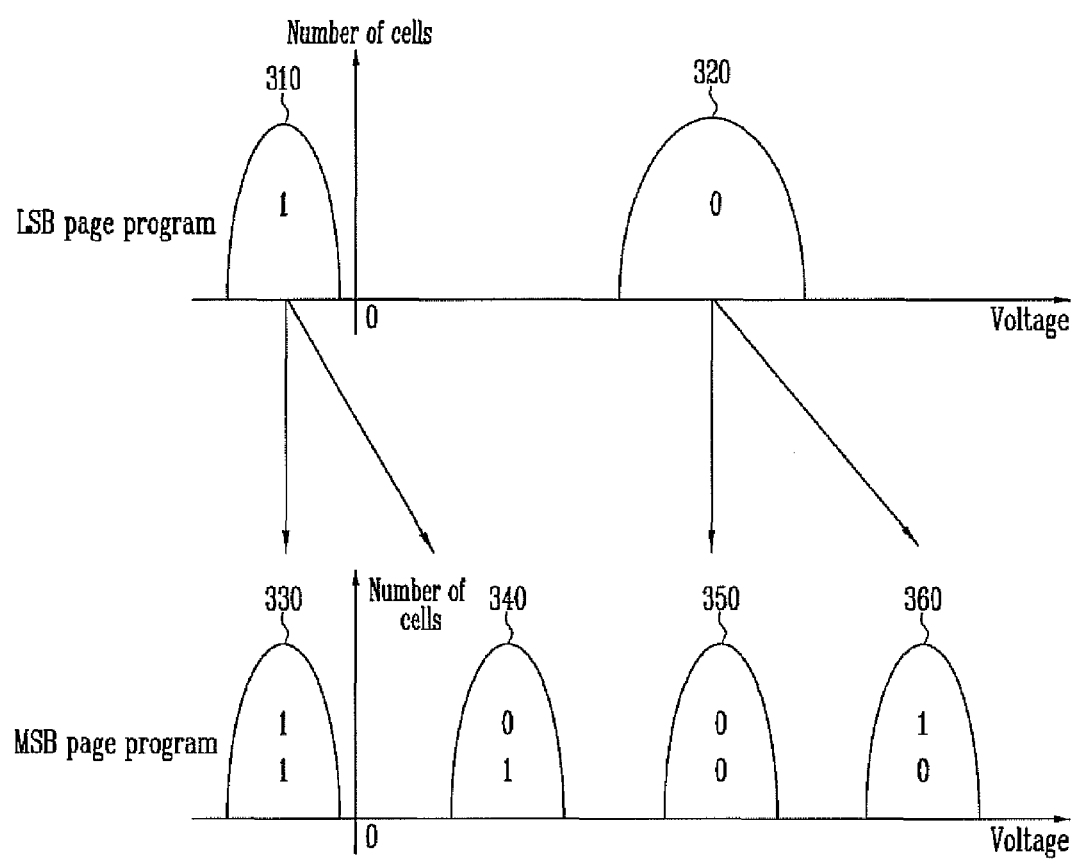

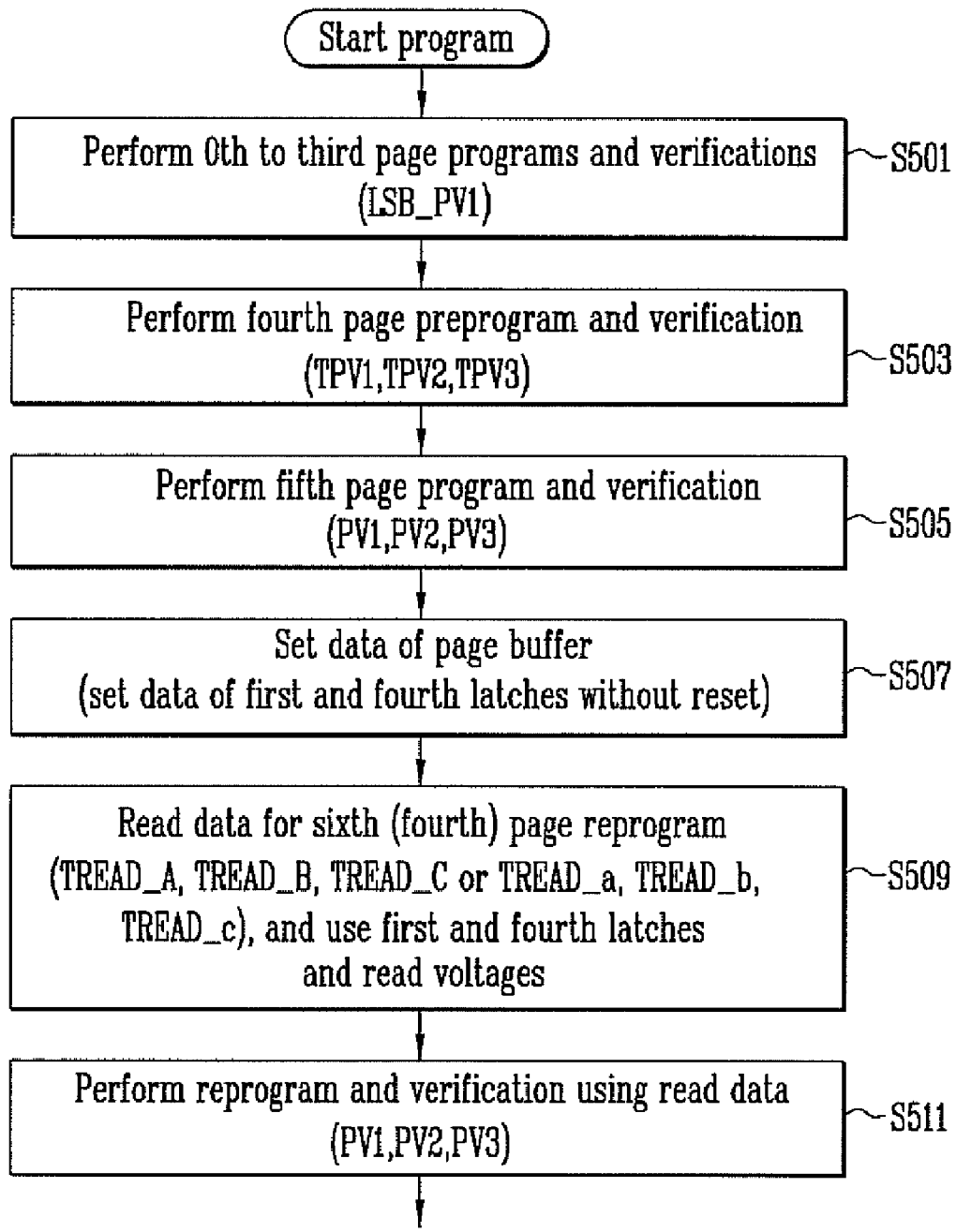

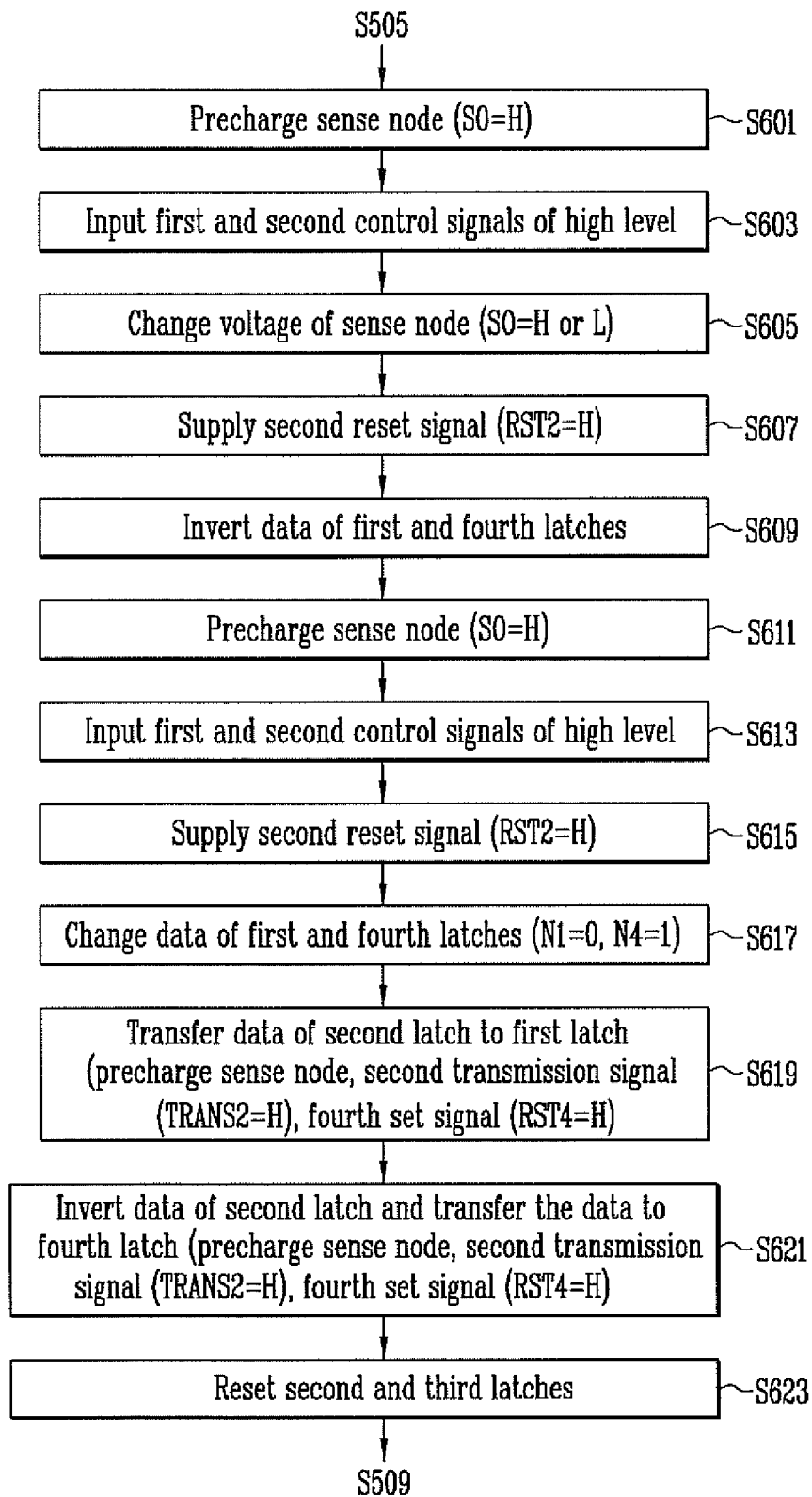

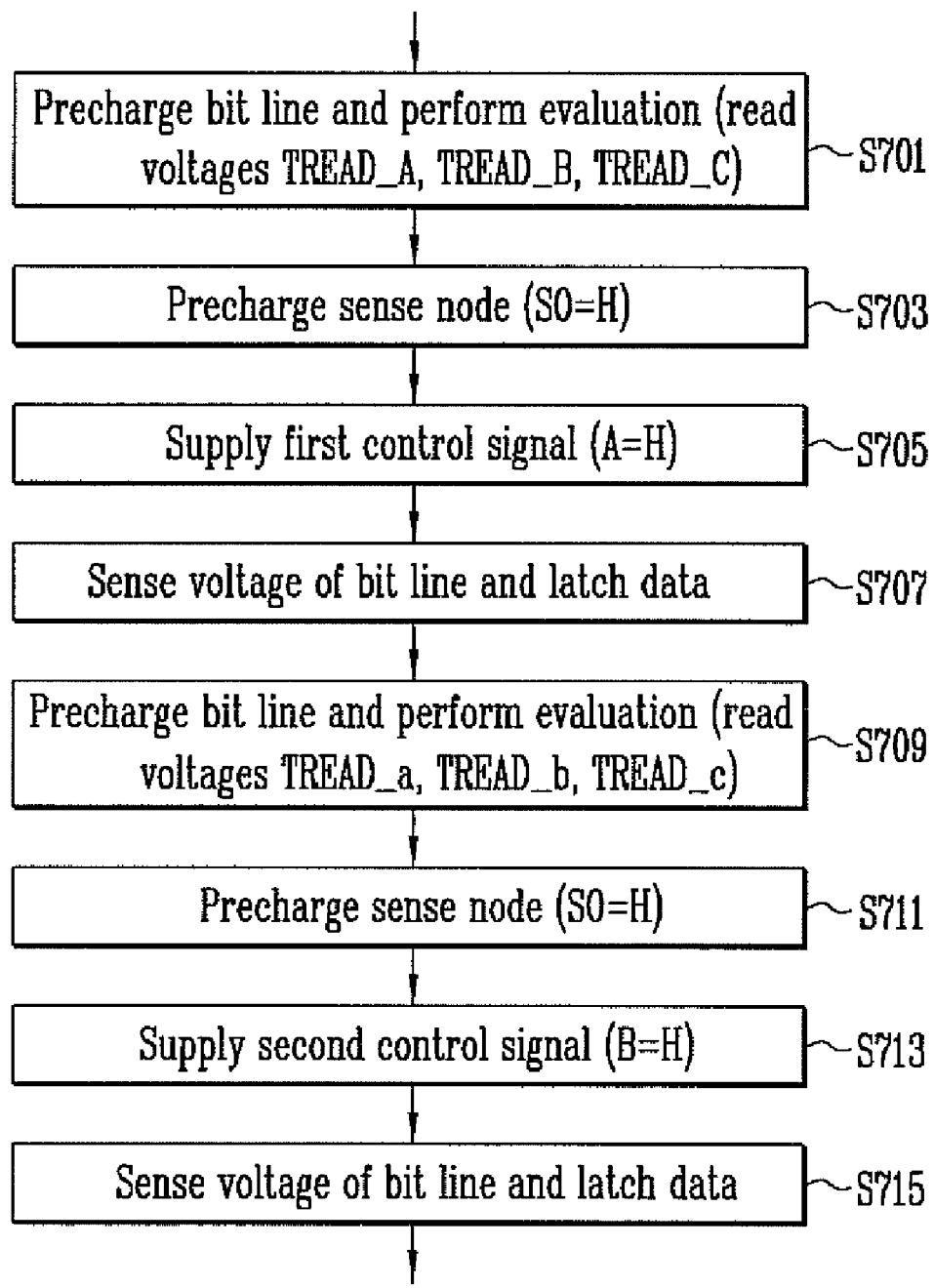

SEMICONDUCTOR MEMORY DEVICE AND METHOD OF OPERATING THE SAME

CROSS-REFERENCE TO RELATED APPLICATION

Priority to Korean patent application number 10-2009-0125987 filed on Dec. 17, 2009, the entire disclosure of which is incorporated by reference herein, is claimed.

BACKGROUND

Exemplary embodiments relate to a semiconductor memory device and a method of operating the same.

Semiconductor memory devices are storage devices in which data can be stored and from which the data can be read. Examples of the semiconductor memory devices are Random Access Memory (RAM) and Read Only Memory (ROM). As to RAMs, data stored therein are erased when the supply of power is stopped. This type of memory is referred to as volatile memory. As to ROMs, data stored therein is not erased when the supply of power is stopped. This type of memory is referred to as a nonvolatile memory.

As to semiconductor memory devices, functions that the semiconductor memory device performs increase proportionally to an increase in the integration, capacity, and chip size.

In order to further increase the degree of integration of semiconductor memory devices, a multi-bit cell capable of storing plural bits of data in one memory cell are used as opposed to a memory cell capable of storing a single bit ("a single level cell").

The multi-level cell has a plurality of threshold voltages corresponding to the number of bits storable in the multi-level cell. In achieving higher integration, the threshold gaps between the threshold voltages become increasingly narrow.

Here, prevention of the threshold voltages of memory cells from being changed due to the capacitive coupling resulting from the threshold voltages of neighboring memory cells during a program operation in a semiconductor memory device is useful.

BRIEF SUMMARY

According to an exemplary embodiment, a semiconductor memory device and a method of operating the same is related to a multi-level cell capable of storing 2 bits of data or more. Data to be programmed in a memory cell is stored in a page buffer, and a read voltage is changed depending on whether the threshold voltage of a memory cell to be reprogrammed has been changed, the data to be programmed is read using the changed read voltage, and a reprogram operation using the read data is performed.

A semiconductor memory device according to an aspect of the present disclosure comprises memory blocks having a plurality of memory cells coupled to a plurality of bit lines, a first latch group coupled to a sense node and configured to store data to be programmed into memory cells, wherein the memory cells are coupled to the bit lines and the sense node is coupled to at least one of the bit lines, a second latch group coupled to the sense node and configured to receive the data of the first latch group, and a sense node voltage control circuit configured to control a voltage of the sense node according to data stored in the first latch group.

A method of operating a semiconductor memory device according to another aspect of this disclosure comprises a step of performing a preprogram and verification for a most significant bit (MSB) page of a first memory cell such that a threshold voltage of the first memory cell is lower than a target voltage; a step of performing a program and verification on a second memory cell neighboring the first memory cell; a read step of reading data of the MSB page of the first memory cell; and a step of performing a reprogram and verification on the first memory cell such that the threshold voltage of the first memory cells is equal to the target voltage.

A method of operating a semiconductor memory device according to yet another aspect of this disclosure comprises a preprogram and verification step of performing a preprogram and verification for a most significant bit (MSB) page of a first memory cell such that a threshold voltage of the first memory cells is lower than a target voltage; a program and verification step of performing a program and verification for the MSB page of a second memory cell neighboring the first memory cell; a data read step of determining whether the first memory cell is in a first memory cell group for which data is read using a first read voltage group or a second memory cell group for which data is read using a second read voltage group in response to data programmed into the second memory cell; and a reprogram and verification step of performing a reprogram on the MSB page of the first memory cell using the read data such that the threshold voltages of the first memory cells shifts to the target voltage.

A method of operating a semiconductor memory device according to still yet another aspect of this disclosure comprises a first preprogram and verification step of performing a first preprogram and verification for a most significant bit (MSB) page of first memory cell such that a threshold voltage of the first memory cell shifts to a voltage lower than a target voltage; a second preprogram and verification step of performing a second preprogram and verification for the MSB page of a second memory cell neighboring the first memory cell; a data read step of determining that the first memory cell is in a first memory cell group for which data is to be read using a first read voltage group or a second memory cell group for which data is to be read using a second read voltage group based on data programmed into the second memory cell; and a reprogram and verification step of performing a reprogram on the MSB page of the first memory cell using the read data such that the threshold voltage of the first memory cell shifts to the target voltage.

BRIEF DESCRIPTION OF THE DRAWINGS

FIG. 1B is a block diagram of a memory block and a page buffer shown in FIG. 1A;

FIGS. 3A to 3C are diagrams illustrating a problem occurring when a read operation for a reprogram is performed;

FIG. 5 is a flowchart illustrating a reprogram method according to an exemplary embodiment of this disclosure;

FIG. 6 is a flowchart illustrating the data set operation of the page buffer shown in FIG. 5; and FIG. 7 is a flowchart illustrating a data read operation for a reprogram shown in FIG. 5.

DESCRIPTION OF EMBODIMENTS

Hereinafter, some exemplary embodiments of the present disclosure will be described in detail with reference to the accompanying drawings. The description and the drawings are provided to enable one of ordinary skill in the art to make and use the exemplary embodiments of the disclosure.

Figure 1A:
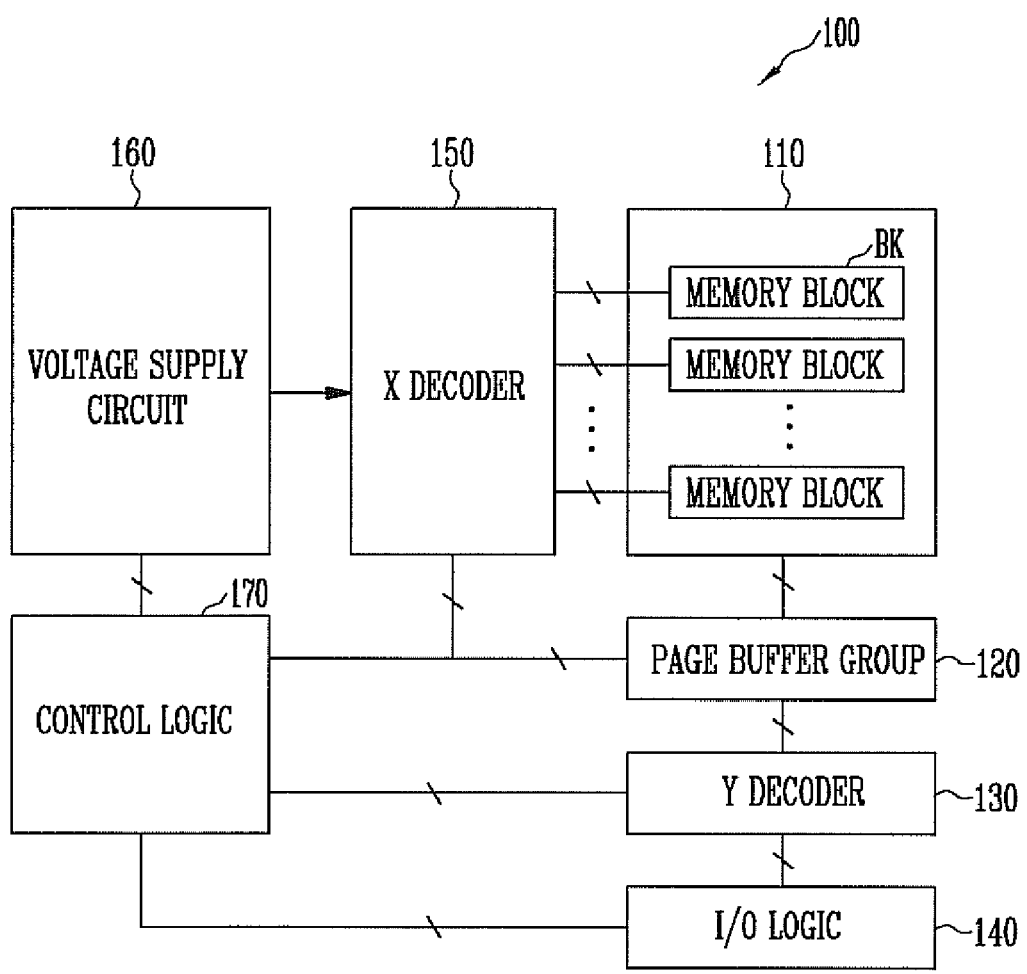
FIG. 1A is a block diagram of a semiconductor memory device illustrating this disclosure.

FIG. 1A is a block diagram of a semiconductor memory device illustrating this disclosure. According to an example, a semiconductor programs first memory cells and second memory cells and, in reprogramming MSB page of the first memory cells, uses first read voltages or second read voltages in reading the first memory cells depending on whether the second memory cells are determined to have first group of threshold voltage distributions or second group of threshold voltage distributions. The distinction between the first group or second group of threshold voltage distributions of the second memory cells may indicate whether the first memory cells have been subjected to significant or less significant capacitive coupling in programming the second memory cells and thus require higher or lower read voltages.

Referring to FIG. 1A, the semiconductor memory device 100 includes a memory cell array 110, a page buffer group 120, a Y decoder 130, an I/O logic 140, an X decoder 150, a voltage supply circuit 160, and a control logic 170.

The memory cell array 110 includes a plurality of memory blocks BK.

Each of the memory blocks BK includes a plurality of cell strings CS. Each of the cell strings CS includes a plurality of memory cells coupled in series.

The cell string CS is coupled to a bit line (that is, BLe or BLo).

According to an example, each of the memory cells is a multi-level cell capable of storing 2 bits of data or more.

The page buffer group 120 includes page buffers coupled to the bit lines of the memory cell array 110.

Each page buffer is configured to temporarily store data to be programmed into a memory cell and driven when a program operation is performed. A corresponding page buffer is driven when a read operation is performed and configured to read data programmed into a memory cell and temporarily store the read data.

The Y decoder 130 provides an I/O path between the page buffer group 120 the page buffer and the I/O logic 140 in response to a control signal generated by the control logic 170.

The I/O logic 140 performs data I/O from and to external systems (not shown) to which the semiconductor memory device 100 is applied.

The X decoder 150 enables one of the memory blocks of the memory cell array 110 in response to a control signal generated by the control logic 170.

Operating voltages generated by the voltage supply circuit 160 are supplied to a memory block enabled by the X decoder 150.

The voltage supply circuit 160 generates the operating voltages in response to a control signal generated by the control logic 170. The operating voltages may include a program voltage, a read voltage, a verification voltage, and an erase voltage.

The control logic 170 generates the control signals for controlling the operations of the page buffer group 120, the Y decoder 130, the I/O logic 140, the X decoder 150, and the voltage supply circuit 160 according to an operation command received via the I/O logic 140.

Interactions between a memory block and a page buffer of the page buffer group 120 are described in more detail below.

FIG. 1B is a block diagram of a memory block and a corresponding page buffer of the memory cell array 110 and the page buffer group 120 in FIG. 1A, respectively.

FIG. 1B is a simplified diagram showing one of the memory blocks BK of the memory cell array 110 and one of the page buffers 121 of the page buffer group 120 in FIG. 1A.

Each of the cell strings CS of the memory block BK includes $0^{th}$ to thirty-first memory cells C0 to C31 coupled in series between a drain select transistor DST and a source select transistor SST.

The drain terminals of the drain select transistors DST are coupled to the respective bit lines. The bit lines include even bit lines BLe and odd bit lines BLo.

A pair of the even bit line BLe and the odd bit line BLo are coupled to the page buffer 121.

The source terminals of the source select transistors SST are in common coupled to a common source line SL.

The gate terminals of the drain select transistors DST are commonly coupled to a drain select line DSL.

The gate terminals of the source select transistors SST are commonly coupled to a source select line SSL.

The gate terminals of the $0^{th}$ to thirty-first memory cells C0 to C31 are coupled to $0^{th}$ to thirty-first word lines WL0 to WL31, respectively.

The page buffer 121 to which the pair of an even bit line BLe and an odd bit line BLo are coupled includes a bit line select circuit 122, a precharge circuit 123, and first to fourth latches 124 to 127.

The bit line select circuit 122 couples one of the even bit line BLe and the odd bit line BLo to a sense node SO in response to the control signal of the control logic 170.

The precharge circuit 123 precharges the sense node SO in response to a control signal of the control logic 170.

The first to fourth latches 124 to 127 temporarily store data to be programmed or store data read from a memory cell when a read operation is performed.

According to an example, the semiconductor memory device 100 includes multi-level cells each capable of storing 2 bits of data.

The unit of memory cells, simultaneously selected when data is programmed or read in the semiconductor memory device 100, is referred to as a page.

In the case of a single level cell for storing data of 1 bit, two pages may exist for one word line. For example, the single level cell may be divided into a case where only the even bit lines BLe are selected and a case where only the odd bit lines BLo are selected, for one word line. Accordingly, two pages exist per word line.

On the other hand, in the case of a multi-level cell for storing 2 bits of data, four pages may exist for one word line.

More specifically, in the multi-level cell, and, for each of a case in which the even bit line BLe is selected and a case in which the odd bit line BLo is selected, there is a page for a least significant bit (hereinafter referred to as an 'LSB') of the multi-level cell and a page for a most significant bit (hereinafter referred to as an 'MSB') of the multi-level cell. Thus, four pages exist per word line.

Here, the threshold voltages of the memory cells of the semiconductor memory device 100 may be changed due to the capacitive coupling with neighboring memory cells.

Figure 2A:
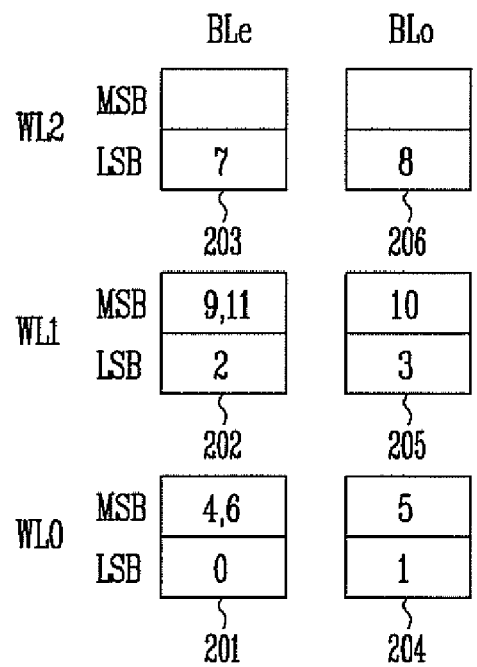
FIG. 2A is a block diagram showing the sequence in which pages are selected for a program operation performed by separately selecting even and odd bit lines.
Figure 2B:
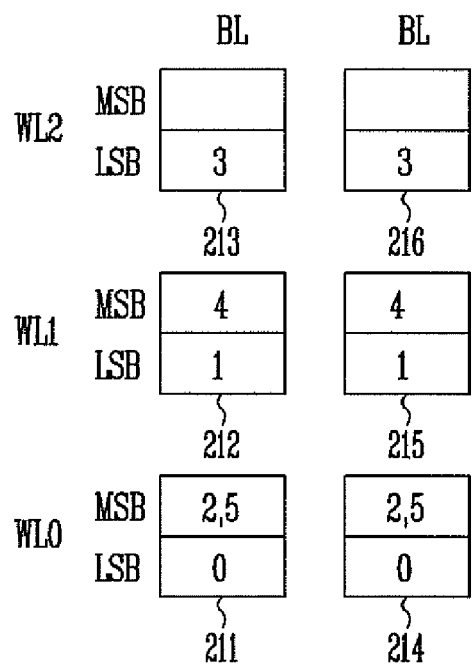
FIG. 2B is a block diagram showing the sequence in which pages are selected for a program operation performed by selecting all the bit lines.

Thus, data may be reprogrammed by using reprogram methods, such as that shown in FIGS. 2A and 2B.

FIG. 2A is a block diagram showing the sequence in which pages are selected for a program operation performed by separately selecting the even and odd bit lines. FIG. 2B is a block diagram showing the sequence in which pages are selected for a program operation performed by selecting all the bit lines.

Figure 2C:
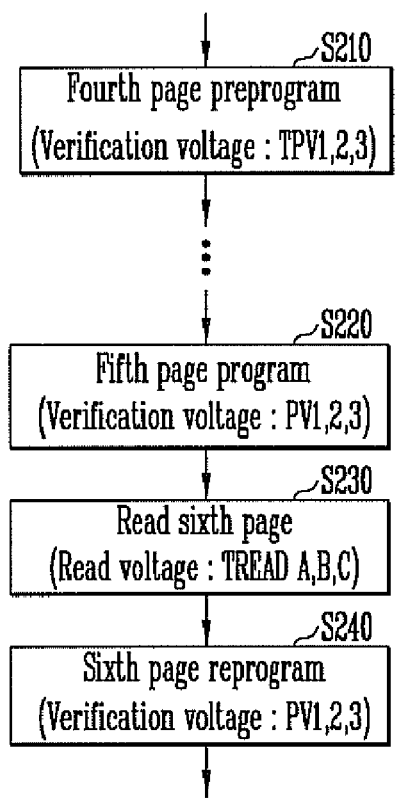
FIG. 2C is a flowchart illustrating a reprogram operation in case where pages are selected as shown in FIG. 2A.
Figure 2D:
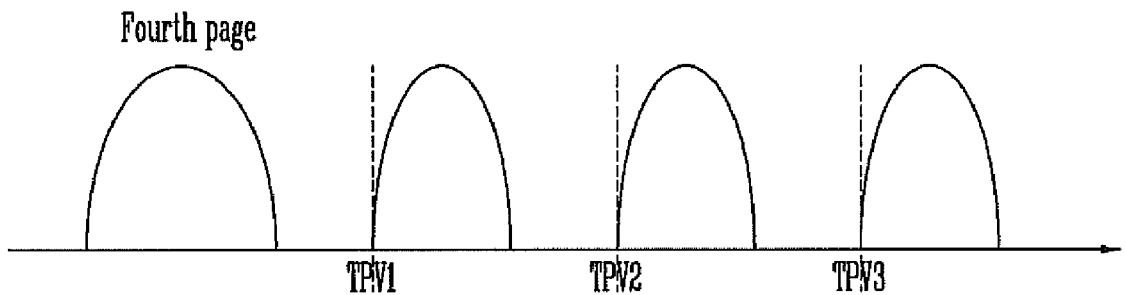
FIGS. 2D and 2E are diagrams showing a shift in the threshold voltages of memory cells according to the reprogram operation.
Figure 2E:
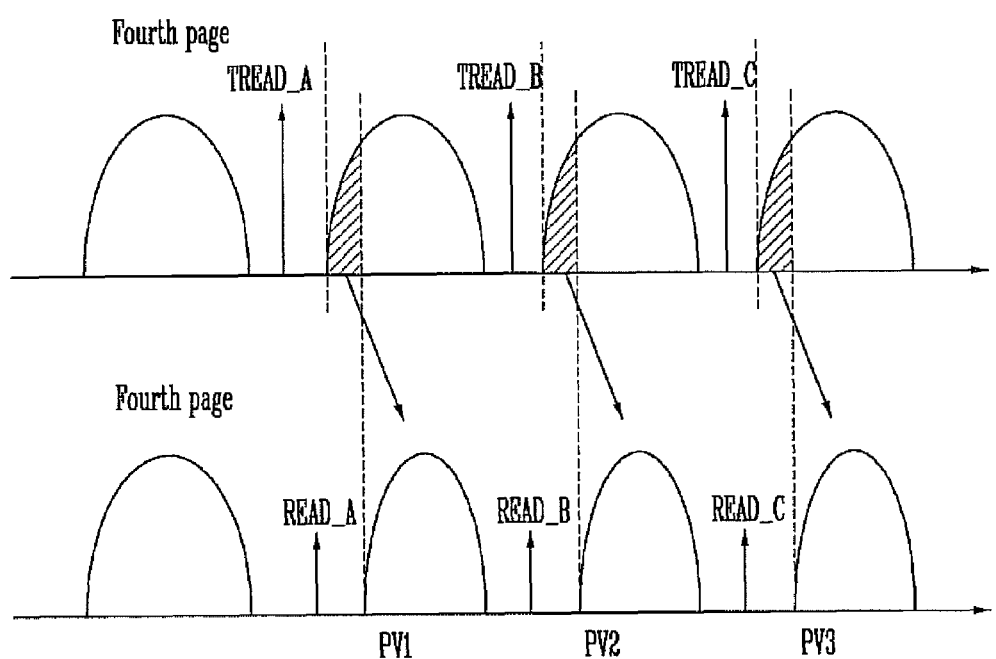

FIG. 2C is a flowchart illustrating a reprogram operation in case where the pages are selected by separately selecting the even and odd bit lines as shown in FIG. 2A. FIGS. 2D and 2E are diagrams showing a shift in the threshold voltages of memory cells according to the reprogram operation.

In FIGS. 2A and 2B, in the memory block BK including the multi-level cells each storing 2 bits of data, some of the memory cells are illustrated as an example in the form of blocks and assigned numbers according to the sequence in which each page is programmed.

In the semiconductor memory device 100, a structure in which the bit lines are coupled to a page buffer 121 in FIG. 1B may be either a structure in which the page buffer 121 is coupled to select the pair of an even bit line BLe and an odd bit line BLo, separately as shown in FIG. 1B, or a structure in which page buffer 121 is coupled to commonly select a pair of bit lines without selecting bit lines BLo and BLe separately.

FIG. 2A shows the case in which the pair of an even bit line BLe and an odd bit line BLo are coupled to a page buffer 121, as shown in FIG. 1B.

In FIG. 2A, among the LSB pages corresponding to a $0^{th}$ word line WL0, the page for the even bit line BLe is the first selected page and is referred to as "zeroth page." After the page for the even bit line BLo from among the LSB pages of the $0^{th}$ word line WL0 is selected, the page for the corresponding odd bit line BLe is subsequently selected.

Next, the LSB pages for the first word line WL1 that correspond to the even and odd bit lines BLe, BLo (that is, second and third pages) are selected in the same mentioned order.

Next, the MSB pages for the $0^{th}$ word line WL0 that correspond to the even and odd bit lines BLe, BLo (that is, fourth and fifth pages) are selected in the same mentioned order.

In a program operation, the even page among an even and odd page pair is first programmed and thus, may be subjected to the capacitive coupling from the program operation of the corresponding odd page. Since the corresponding odd bit line may be subjected to relatively small capacitive coupling, a reprogram operation according to an exemplary embodiment is performed on only the even page.

More specifically, after a program is performed on the fifth page, which is the MSB page corresponding to the $0^{th}$ word line WL0 and the respective odd bit line, the corresponding even bit line is selected and a reprogram is performed on the corresponding even bit line (that is, the sixth page).

After the reprogram, the seventh and eighth pages corresponding to LSB pages for the second word line WL2 and the respective even and odd bit lines BLe, BLo are programmed.

Subsequently, the ninth and tenth pages corresponding to the MSB pages for the first word line WL1 and the respective even and odd bit lines BLe, BLo are programmed.

After a program for the tenth page is completed, a reprogram is performed on the page for the even bit line BLe among MSB pages for the first word line WL1 (eleventh page).

In FIG. 2A, in case where the even bit line BLe and the odd bit line BLo of an even and odd bit line pair are sequentially selected and programmed for MSB and LSB pages, an MSB page program for memory cells coupled to the even bit line BLe and a word line may be performed. Next, the MSB page program for memory cells coupled to the corresponding odd bit line BLo and the word line is performed.

During the time for which the MSB page program for the memory cells coupled to the odd bit line BLo and a word line is performed, the threshold voltages of memory cells coupled to the respective even bit line BLe may be changed due to the capacitive coupling between the bit lines. Thus, a reprogram for the MSB page of the memory cells coupled to the even bit line BLe and the word line is performed.

For example, $0^{th}$ and third LSB and MSB page programs can be performed on the memory cell 201 in FIG. 2A. After a program is performed on the MSB page of the memory cell 204 (fifth page) corresponding to the respective word line and the odd bit line BLo, the reprogram is performed on the MSB page of the memory cell 201 corresponding to the respective word line and the odd bit line BLo (sixth page).

Likewise, after a program is performed on the MSB page of the memory cell 202 (ninth page) and on the MSB page of the memory cell 206 (tenth page) corresponding to the respective odd bit line BLo, the MSB page of the memory cell 202 is reprogrammed (eleventh page).

Meanwhile, in the structure in which the page buffer is coupled to commonly control a bit line pair BL, the sequence in which pages are selected for a program and the sequence in which a reprogram is performed on the pages differs from that of FIG. 2A.

FIG. 2B shows the sequence of programming of pages in the structure in which a page buffer is coupled to commonly control both of the bit line pairs BL.

A $0^{th}$ page (that is, the first programmed page) is the LSB page of the $0^{th}$ word line WL0 that corresponds to the respective bit line pair BL. A second page is the LSB page of the first word line WL1.

Next, the MSB page of the $0^{th}$ word line WL0 is selected (second page), and the LSB page of the second word line WL2 is then selected (third page).

A fourth page is the MSB page of the first word line WL1. During the time for which a program is performed on the MSB page of the first word line WL1, the threshold voltages of the memory cells 211 and 214 of the $0^{th}$ word line WL0 may be changed due to the capacitive coupling from neighboring cells.

For this reason, after the fourth page program, a reprogram is performed on the MSB page of the $0^{th}$ word line WL0 (fifth page).

More specifically, in case where a page buffer is coupled to commonly control a pair of bit lines BL, after a program for the MSB page of memory cells coupled to a word line (for example, the first word line WL1) is performed, a reprogram is performed on the MSB page of a lower word line (for example, the $0^{th}$ word line WL0).

After the MSB program for a memory cell is performed as in FIGS. 2A and 2B, where the MSB program may affect the thresholds of an already programmed, neighboring memory cell, the MSB program for the neighboring memory cell is performed again.

In FIGS. 2A and 2B, the initial program of a page on which a reprogram is performed is referred to as a 'preprogram', and the subsequent program of the same page is referred to as a 'reprogram'.

According to an example, when verification voltages used when the MSB program for memory cells each capable of storing 2 bits of data is performed are PV1, PV2, and PV3, program verification is performed using TPV1, TPV2, and TPV3 which are lower than the verification voltages PV1, PV2, and PV3 after a preprogram is performed.

More specifically, the memory cells are programmed to have threshold voltages lower than final threshold voltages during the preprogram since the threshold voltages of the preprogrammed memory cells may be changed due to the capacitive coupling from neighboring cells.

FIG. 2C shows a part of the flowchart in which a program is performed according to the sequence for selecting pages in FIG. 2A.

A program is performed starting from the $0^{th}$ page, and a preprogram is performed on the fourth page at step S210. Here, temporary verification voltages TPV1, TPV2, and TPV3 are used as program verification voltages.

FIG. 2D shows threshold voltage distributions of memory cells in case where a preprogram verification is performed using the temporary verification voltages TPV1, TPV2, and TPV3.

A program operation is performed on the fifth page at step S220. A preprogram is not performed on the fifth page because the fifth page is a page corresponding to the odd bit line BLo among MSB pages for the $0^{th}$ word line WL0. A program for the fifth page is performed using the verification voltages PV1, PV2, and PV3.

After the program for the fifth page is completed, a reprogram is performed on the page corresponding to the even bit line BLe among MSB pages of the $0^{th}$ word line WL0. To this end, the sixth page is read at step S230 using read voltages TREAD_A, TREAD_B, and TREAD_C. However, as will be discussed later, read voltages TREAD_A, TREAD_B, and TREAD_C may not be appropriate when, for example, an MSB page of neighboring memory cells are programmed to higher threshold regions among possible states for the MSB page based on the programmed LSB page state of the neighboring cells so that the capacitive coupling from the neighboring cells is relatively significant and shifts the threshold voltages of previously programmed MSB page for the $0^{th}$ word line. As such, according to an example, higher read voltages than the read voltages TREAD_A, TREAD_B, and TREAD_C are used in reading the page corresponding to the even bit line BLe among MSB pages of the $0^{th}$ word line WL0.

The sixth page is the page corresponding to the even bit line BLe among MSB pages of the $0^{th}$ word line WL0 and is the same page as the fourth page.

The reprogram for the fourth page has been performed on the sixth page at step S240. Verification of the preprogram is performed using the verification voltages TPV1, TPV2, and TPV3. Read voltages TREAD_A, TREAD_B, and TREAD_C are used at step 230 to read initially programmed data.

Data read at step S230 is stored in the page buffer 121. The reprogram is performed by using the data stored in the page buffer 121 at the fourth page program. The verification voltages for the reprogram are PV1, PV2, and PV3 and are used to reprogram the MSB page of the $0^{th}$ word line WL0 that corresponds to the even bit line.

According to the above described steps, the threshold voltages of the memory cells, changed due to the capacitive coupling from neighboring memory cells during the program operation of the fifth page can be corrected.

In FIG. 2E, the threshold voltage distributions of memory cells initially programmed to have threshold voltage distributions shown in FIG. 2D widen due to the capacitive coupling from neighboring memory cells when a program operation is performed on neighboring memory cells.

The read voltages READ_A, READ_B, and READ_C are used to read data after the reprogram is performed. If a threshold voltage distribution is reduced in width, a read margin is increased when data is read because a gap between the reduced threshold voltage distribution and a neighboring threshold voltage distribution widens.

The reprogram is a method of reducing the width of the threshold voltage distribution as described above. However, an error may occur in the reprogram in that data may be erroneously read in the read operation at step S230 of FIG. 2C. For example, if the read voltages TREAD_A, TREAD_B, and TREAD_C are used in reading the page corresponding to the even bit line BLe among MSB pages of the $0^{th}$ word line WL0 when the capacitive coupling from neighboring memory cells shifts threshold voltage of the memory cells belonging to the page higher, use of the read voltages TREAD_A, TREAD_B, and TREAD_C to read the preprogrammed memory cells may result in erroneous data reading.

Figure 3B:
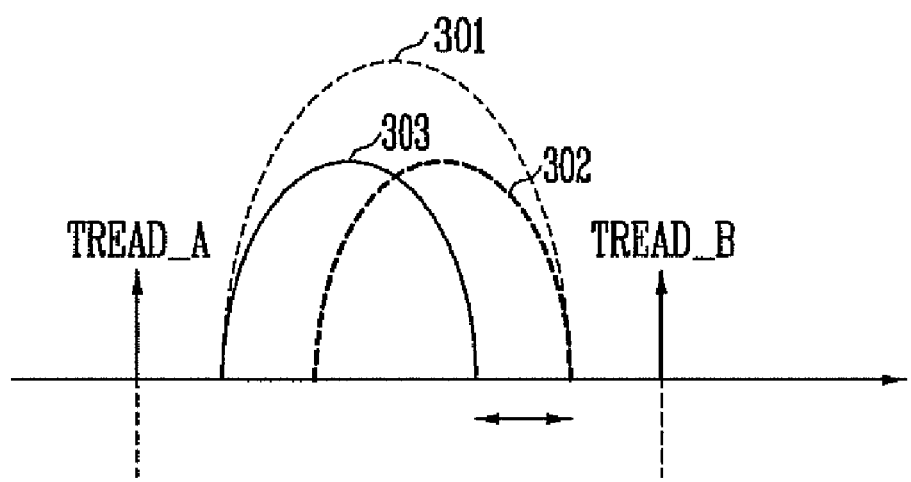
Figure 3C:
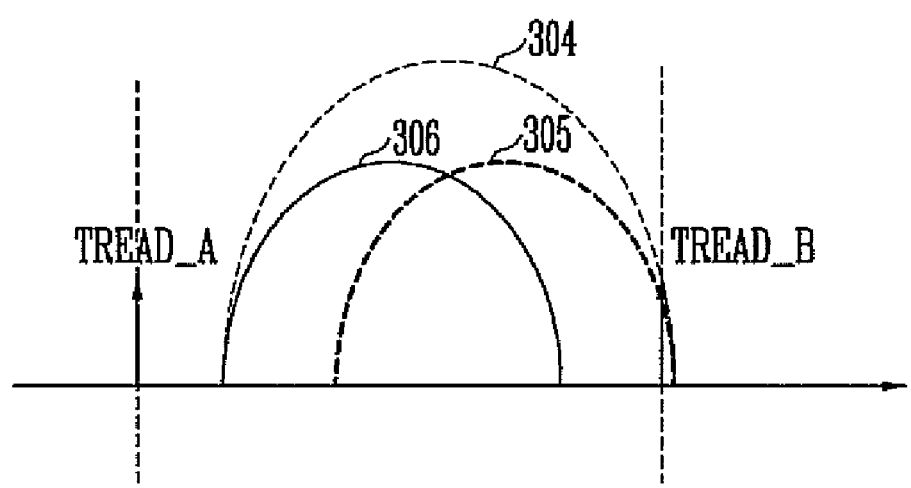

FIGS. 3A to 3C are diagrams illustrating an occurrence of an error during a read operation for a reprogram.

FIG. 3A shows distributions of the threshold voltages of multi-level cells, each storing 2 bits of data, after a program operation is performed.

FIG. 3B shows distributions of threshold voltages of the memory cells without a shift in the threshold voltages when a read operation for a reprogram is performed. FIG. 3C shows distributions of threshold voltage of the memory cells with a shift in the threshold voltages when a read operation for a reprogram is performed.

Referring to FIG. 3A, when an LSB page program is performed on memory cells each capable of storing 2 bits of data, the threshold voltages of the memory cells are included in any one of first and second threshold voltage distributions 310 and 320.

Next, when an MSB page program, the threshold voltages of the memory cells are included in any one of third to sixth threshold voltage distributions 320 to 360.

When the MSB page program is performed, the threshold voltages of some of memory cells included in the first threshold voltage distribution 310 are shifted to be included in the third threshold voltage distribution 330 in which an erase state is maintained, and the threshold voltages of the remaining memory cells are shifted to be included in the fourth threshold voltage distribution 340 after a program operation.

The threshold voltages of some of memory cells included in the second threshold voltage distribution 320 are shifted to be included in the fifth threshold voltage distribution 350, and the threshold voltages of the remaining memory cells are shifted to be included in the sixth threshold voltage distribution 360.

In FIG. 3A, when an MSB page program is performed after an LSB page program is performed, the degree that the threshold voltages of memory cells are shifted is greater in the case in which the threshold voltages of the memory cells are shifted to the fourth and sixth threshold voltage distributions 340 and 360 than in the case where the threshold voltages of the memory cells are shifted to the third and fifth threshold voltage distributions 330 and 350.

Accordingly, if the threshold voltages of the neighboring memory cells are programmed to fall within the fourth and sixth threshold voltage distributions 340 and 360, the capacitive coupling on preprogrammed memory cells is great. If the threshold voltages of the neighboring memory cells are programmed to fall within the third and fifth threshold voltage distributions 330 and 350, the capacitive coupling on preprogrammed memory cells is small.

Referring to FIG. 3B, the threshold voltage distribution 301 influenced by the capacitive coupling that occurs when memory cells are programmed.

The threshold voltage distribution 301 indicates a threshold voltage distribution of all memory cells included in a page influenced by the capacitive coupling that results from a program operation for neighboring memory cells.

The threshold voltages of some of the memory cells included in the threshold voltage distribution 301 may be greatly shifted due to significant capacitive coupling, but the threshold voltages of the remaining memory cells may be slightly shifted due to less significant capacitive coupling.

The threshold voltage distribution 302 indicates a threshold voltage distribution of memory cells in case where the threshold voltages of the memory cells are greatly shifted due to significant or less significant capacitive coupling.

According to an example, the memory cells having threshold voltages included in the threshold voltage distribution 302 may be programmed to be included in the fourth or sixth threshold voltage distributions 340 and 360.

According to an example, the memory cells having threshold voltages included in the threshold voltage distribution 303 may be programmed to be included in the third or fifth threshold voltage distribution 330 or 350.

Despite the capacitive coupling effect, the threshold voltage distributions 301 to 303 are between and may be read using the read voltages TREAD_A and TREAD_B used for a reprogram in FIG. 3B.

In case where a greater capacitive coupling exists between neighboring cells as compared with FIG. 3B, the threshold voltages of memory cells may be shifted as shown in FIG. 3C.

However, in the case of FIG. 3C, the capacitive coupling resulting from a program for neighboring memory cells is even greater as compared with FIG. 3B, and so the width of the threshold voltage distribution 304 is widened to extend beyond the read voltage TREAD_B.

The threshold voltage distribution 306 of memory cells exists between the read voltages TREAD_A and TREAD_B, but the threshold voltage distribution 305 of memory cells influenced by the capacitive coupling is widened to extend beyond the read voltage TREAD_B.

In case where there is a great coupling effect as shown in FIG. 3c, if a read for a reprogram is performed using the read voltages TREAD_A and TREAD_B, the data of some of memory cells included in the threshold voltage distribution 305 may be erroneously read.

Next, if the reprogram is performed using the erroneously read data, data different from the intended data is stored.

In order to prevent such an erroneous data reading in the reprogram operation, a method of decreasing the step voltage increase of a program voltage supplied according to an Increment Step Pulse Program (ISPP) method may be used. However, if the step voltage increase is decrease, the total program time may increase.

For this reason, a reprogram operation, such as that described below, is performed by using a page buffer 400 according to an exemplary embodiment of this disclosure in the semiconductor memory device 100 of FIG. 1A.

Figure 4A:
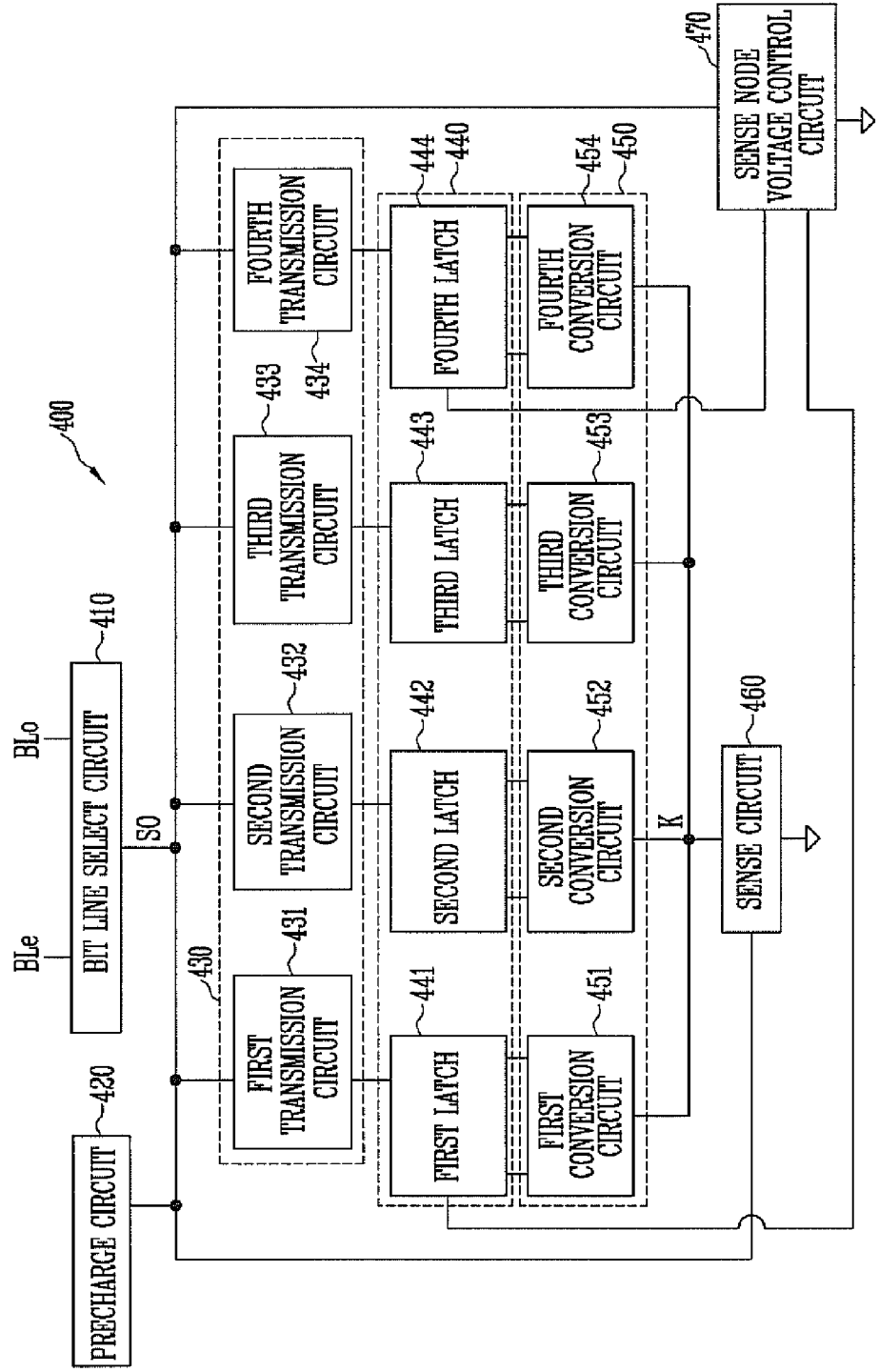
FIG. 4A is a block diagram of a page buffer according to an exemplary embodiment of this disclosure.

FIG. 4A is a block diagram of the page buffer 400 according to the exemplary embodiment of this disclosure.

In FIG. 4A, the same reference numerals of FIG. 1A are used to refer to the function blocks shown in FIG. 1A that are used in conjunction with the page buffer 400 in FIG. 4A used as a part of the page buffer group 120 in FIG. 1A.

Referring to FIG. 4A, the page buffer 400 according to the exemplary embodiment of this disclosure includes a bit line select circuit 410, a precharge circuit 420, a transmission circuit group 430, a latch group 440, a conversion circuit group 450, a sense circuit 460, and a sense node voltage control circuit 470.

The bit line select circuit 410 selects the even bit line BLe or the odd bit line BLo in response to control signals generated by the control logic 170. The selected bit line BLe or BLo is coupled to the sense node SO.

The bit line select circuit 410 precharges or discharges the even bit line BLe or the odd bit line BLo or both in response to control signals generated by the control logic 170.

The precharge circuit 420 precharges the sense node SO in response to a control signal generated by the control logic 170.

The latch group 440 includes first to fourth latches 441 to 444.

The transmission circuit group 430 includes first to fourth transmission circuits 431 to 434.

The first to fourth transmission circuits 431 to 434 transmit data, stored in the first to fourth latches 441 to 444, to the sense node SO in response to first to fourth transmission signals TRANS1 to TRANS4 generated by the control logic 170, respectively.

The conversion circuit group 450 includes first to fourth conversion circuits 451 to 454.

The first to fourth conversion circuits 451 to 454 are coupled to the first to fourth latches 441 to 444, respectively, and also coupled to a node K. The first to fourth conversion circuits 451 to 454 change or maintain data stored in the first to fourth latches 441 to 444, respectively.

The sense circuit 460 couples the node K and a ground node or places the node K in a floating state according to a voltage level of the sense node SO.

When a reprogram operation is performed, the sense node voltage control circuit 470 changes a voltage level of the sense node SO on the basis of data stored in the first or fourth latches 441 or 444 in response the first and second control signals A and B.

In another exemplary embodiment, the sense node voltage control circuit 470 may not be included as a circuit within the page buffer 400, but may be included as a logic component within the control logic 170.

If the sense node voltage control circuit 470 is included as a logic component within the control logic 170, the first and fourth latches 441 and 444 are to receive data and output a control signal for changing a voltage of the sense node SO.

Figure 4B:
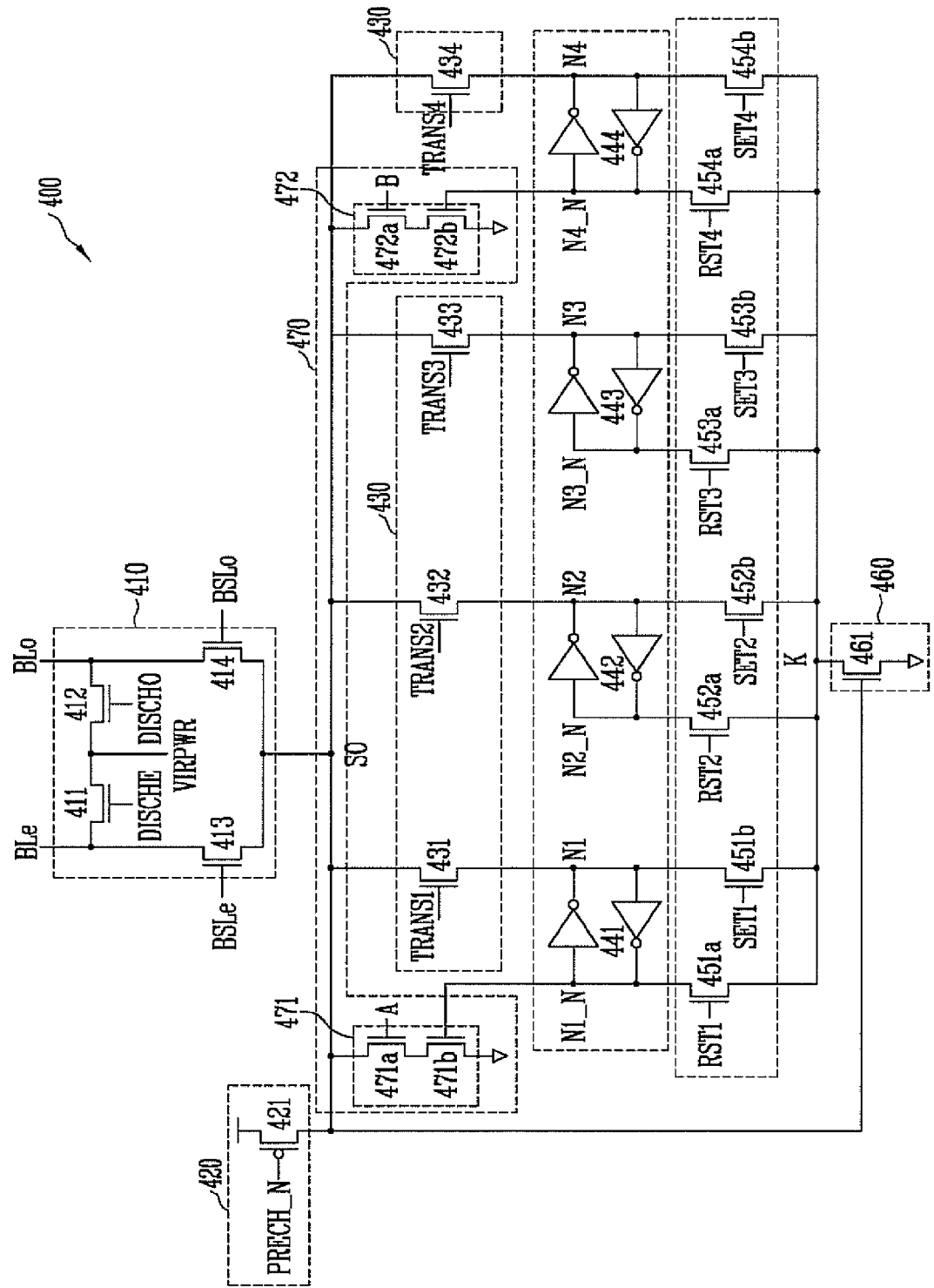
FIG. 4B is a detailed circuit diagram of the page buffer shown in FIG. 4A.

FIG. 4B is a detailed circuit diagram of the page buffer 400 shown in FIG. 4A.

Referring to FIG. 4B, the bit line select circuit 410 includes NMOS transistors 411 and 412 configured to precharge or discharge the even or odd bit line BLe or no, an NMOS transistor 413 coupled between the even bit line BLe and the sense node SO, and an NMOS transistor 414 coupled between the odd bit line BLo and the sense node SO.

The NMOS transistors 411 and 412 are coupled in series between the even bit line BLe and the odd bit line BLo. A variable voltage VIRPWR is supplied to an intervening node between the NMOS transistors 411 and 412.

The NMOS transistors 411 and 412 are turned on or turned off in response to an even discharge control signal DISCHE and an odd discharge control signal DISCHO, respectively.

When the bit line BLe or BLo is to be precharged, the variable voltage becomes a power supply voltage. When the bit line BLe or BLo is to be discharged, the variable voltage becomes a ground voltage.

The NMOS transistor 413 couples the even bit line BLe and the sense node SO in response to an even bit line select signal BSLe. The NMOS transistor 414 couples the odd bit line BLo and the sense node SO in response to an odd bit line select signal BSLo.

The precharge circuit 420 includes a PMOS transistor 421. The PMOS transistor 421 transfers the power supply voltage to the sense node SO in response to a precharge control signal PRECH_N.

Each of the first to fourth transmission circuits 431 to 434 is formed of an NMOS transistor. The first to fourth transmission circuits 431 to 434 transmit data, stored in the respective nodes N1, N2, N3, and N4 of the first to fourth latches 441 to 444, to the sense node SO in response to the first to fourth transmission signals TRANS1 to TRANS4, respectively.

Each of the first to fourth latches 441 to 444 is formed of two inverters.

The first conversion circuit 451 (as shown in FIG. 4A) includes an NMOS transistor 451a for coupling the node K and the node N1_1 of the first latch 441 in response to a first reset signal RST1 and an NMOS transistor 451b for coupling the node K and the node N1 of the first latch 441 in response to a first set signal SET1.

The second conversion circuit 452 includes an NMOS transistor 452a for coupling the node K and the node N2_N of the second latch 442 in response to a second reset signal RST2 and an NMOS transistor 452b for coupling the node K and the node N2 of the second latch 442 in response to a second set signal SET2.

The third conversion circuit 453 includes an NMOS transistor 453a for coupling the node K and the node N3_N of the third latch 443 in response to a third reset signal RST3 and an NMOS transistor 453b for coupling the node K and the node N3 of the third latch 443 in response to a third set signal SET3.

The fourth conversion circuit 454 includes an NMOS transistor 454a for coupling the node K and the node N4_N of the fourth latch 444 in response to a fourth reset signal RST4 and an NMOS transistor 454b for coupling the node K and the node N4 of the fourth latch 444 in response to a fourth set signal SET4.

The sense circuit 460 includes an NMOS transistor 461 for coupling the node K and a ground node according to a voltage level of the sense node SO. The NMOS transistor 461 is turned on when a voltage of the sense node SO is precharged to a high level.

The sense node voltage control circuit 470 includes a first control circuit 471 and a second control circuit 472.

The first control circuit 471 includes two NMOS transistors 471a and 471b coupled in series between the sense node SO and the ground node.

The NMOS transistor 471a is turned on in response to the first control signal A, and the NMOS transistor 471b is turned on according to data stored in the node N1_N of the first latch 441.

The second control circuit 472 includes two NMOS transistors 472a and 472b coupled in series between the sense node SO and the ground node.

The NMOS transistor 472a is turned on in response to the second control signal B, and the NMOS transistor 472b is turned on according to data stored in the node N4_N of the fourth latch 444.

A method of performing a reprogram using the page buffer 400 according to an exemplary embodiment of this disclosure is described below.

FIG. 5 is a flowchart illustrating a reprogram method according to an exemplary embodiment of this disclosure.

In describing the flowchart, reference is made to the semiconductor memory device 100 of FIG. 1a, the sequence of FIG. 2A, and the page buffer 400 of FIG. 4B.

Referring to FIGS. 1A, 2A, 4B, and 5, a description of the well known process for inputting a program command, an address, and data, a process of selecting a memory block and a page on the basis of address information and generating the operating voltages, and a process of repeating program and verification while changing a page address is omitted.

Data for an LSB page program is stored in the first or fourth latch 441 or 444 of the page buffer 400 and then copied to the second or third latch 442 or 443. Program and verification are performed by using the second or third latch 442 or 443.

Data for an MSB page program is stored in one of the first and fourth latches 441 and 444 of the page buffer 400, and LSB data is stored in the remaining latches. The LSB data is data stored by reading an LSB page after the LSB page is selected.

The data stored in the first and fourth latches 441 and 444 is copied to the second and third latches 442 and 443 and then programmed by using the second and third latches 442 and 443.

When the program is started, the $0^{th}$ to third pages of FIG. 2A are sequentially selected, and program and verification for the selected LSB pages are performed at step S501. Here, after the LSB page program is performed, the LSB page verification using a verification voltage LSB_PV1 is performed.

The fourth page is selected, and a preprogram and verification for the fourth page are performed at step S503. Here, the verification for the preprogram is performed using the verification voltages TPV1, TPV2, and TPV3.

Next, the fifth page is selected, and an MSB page program is performed on the fifth page at step S505. The fifth page is not subjected to a reprogram because it is coupled to the odd bit line BLo. Verification for the MSB page program of the fifth page is performed using the verification voltages PV1, PV2, and PV3.

When the MSB page program for the fifth page is performed, MSB data and LSB data are stored in the first and fourth latches 441 and 444 of the page buffer 400, respectively. Since the MSB page program is performed using the second and third latches 442 and 443, the MSB data and LSB data stored in the first and fourth latches 441 and 442 remain intact although the program and verification for the fifth page are performed.

In general, before a program for a next page is performed, the first to fourth latches 441 to 444 of the page buffer 400 are reset. However, according to an exemplary embodiment of this disclosure, the latches of the page buffer 400 are not reset for the purpose of a reprogram.

In the exemplary embodiment of this disclosure, in the state in which the program and verification for the fifth page have been performed, the data stored in the first and fourth latches 441 and 444 of the page buffer 400 is set in order to control a voltage of the sense node SO at step S507.

When the data set operation is performed, data stored in the node N1_N of the first latch 441 of the page buffer 400 coupled to a memory cell (hereinafter referred to as a 'cell A') greatly influenced by a coupling effect and for which larger read voltages are to be used becomes '0'. Meanwhile, data stored in the node N1_N of the first latch 441 of the page buffer 400 coupled to a memory cell (hereinafter referred to as a 'cell B') slightly influenced by a coupling effect and for which smaller read voltages are to be used becomes '1'.

The data set operation at step S507 is described in detail later with reference to FIG. 6. Briefly, whether a memory cell to be reprogrammed have been subjected to significant capacitive coupling and thus higher read voltages are to be used for the memory cell is set by storing data corresponding to MSB and LSB pages of a neighboring cell in latches, where data is used to distinguish different threshold distributions of the neighboring memory cell.

As a result of the data set operation, data stored in the node N4_N of the fourth latch 444 of the page buffer 400 coupled to the cell A becomes '1' and data stored in the node N4_N of the fourth latch 444 of the page buffer 400 coupled to the cell B becomes '0'.

After the data set operation is performed, in order to perform a reprogram for the sixth page, the data of the sixth page is read and stored in the second and third latches 442 and 443 of the page buffer 400 at step S509 where data of the sixth page is stored by different operations of the page buffer where the different operations occur in response to the stored data of the first and fourth latches 441 and 444 at step S507.

The data of the cell B is read using the read voltages TREAD_A, TREAD_B, and TREAD_C, and the data of the cell A is read using read voltages TREAD_a, TREAD_b, and TREAD_c. Different read voltages are to be used for the cell A and the cell B. In the semiconductor memory device 100, program and read operations are performed on a page by page basis. In case where the cells A and the cells B are included in one page, when the data of the cells A and the cells 13 is read using different read voltages, respectively, the data of the other cells (e.g., cells B) is not stored in the page buffer 400 during the individual cell read (e.g., cells A).

To this end, the sense node voltage control circuit 470 is used.

A detailed operation of the step S509 in which data is read using different read voltages is described later with reference to FIG. 7.

After the read data is stored in the second and third latches 442 and 443 of the page buffer 400 at step S509, a reprogram for the sixth page is performed on the basis of the stored data at step S511. Verification for the reprogram is performed using the verification voltages PV1, PV2, and PV3.

If a program is performed again on a page, a preprogram and a reprogram are performed on the MSB page for the even bit line BLe as described above, and the program is performed on the MSB page of the odd bit line BLo just once.

If the reprogram is performed as described above, a read voltage may be changed according to the degree that a memory cell is influenced by the capacitive coupling. Accordingly, appropriate reliability in reading data before the reprogram is performed may be obtained, and appropriate reliability of data after the reprogram is performed may be obtained.

Meanwhile, the data set operation at step S507 is described in detail below.

FIG. 6 is a flowchart illustrating the data set operation of the page buffer shown in FIG. 5.

Referring to FIG. 6, in order to set the data of the first and fourth latches 441 and 444 of the page buffer 400, first, the precharge circuit 420 precharges a voltage of the sense node SO to a high level at step S601. Data stored in each of the nodes N2 and N3 of the second and third latches 442 and 443 is '0'.

As described above with reference to FIGS. 3A to 3C, the cell A greatly influenced by the capacitive coupling has a neighboring memory cell programmed to have a threshold voltage included in the threshold voltage distributions 340 and 360, and the cell B slightly influenced by the capacitive coupling has a neighboring memory cell programmed to have a threshold voltage included in the threshold voltage distributions 330 and 350.

Data states corresponding to the threshold voltage distributions 330 to 360 are listed in Table 1 below.

TABLE 1

| | DISTRIBUTION OF THRESHOLD VOLTAGES | | | |
|---|---|---|---|---|
| | 330 | 340 | 350 | 360 |
| LSB | 1 | 1 | 0 | 0 |
| MSB | 1 | 0 | 0 | 1 |

Referring to Table 1, after the program for the fifth page is performed, an LSB of a memory cell which neighbors a memory cell to be reprogrammed is stored in the node N4 of the fourth latch 444, and MSB of a memory cell which neighbors a memory cell to be reprogrammed is stored in the node N1 of the first latch 441.

A memory cell to be reprogrammed and adjacent to a neighboring memory cell programmed to have a threshold voltage included in the threshold voltage distributions 330 and 350 is the cell B, and a memory cell to be reprogrammed and adjacent to a neighboring memory cell programmed to have a threshold voltage included in the threshold voltage distributions 340 and 360 is the cell A.

The data stored in the node N1 of the first latch 441 is to be set to '1' for the cell B, and the data stored in the node N4 of the fourth latch 444 is to be set to '1' for the cell A. The stored data is received from the neighboring memory cell via, for example, NMOS transistor 414 by applying a high BSLO signal.

In the state in which a voltage of the sense node SO is precharged to a high level, the first and second control signals A and B of a high level are inputted at step S603.

In response to the first and second control signals A and B of a high level, the NMOS transistors 471a and 472a are turned on. The NMOS transistors 471b and 472b are turned on or off according to the data of the nodes N1_N and N4_N.

In response to the NMOS transistors 471b and 472b being turned on or off, a voltage precharged in the sense node SO is maintained or discharged at step S605.

When the fifth page program is performed, data stored in the nodes N1 and N4 of the first and fourth latches 441 and 444 of the page buffer 400 coupled to the memory cell programmed to have a threshold voltage included in the threshold voltage distributions 330 and 350 is '1' or '0'.

After the fifth page program, since MSB data and LSB data of a neighboring memory cell adjacent to a memory cell to be reprogrammed are stored in different ones of the first and fourth latches, respectively, as described above, one of data stored in the nodes N1 and N4 of the first and fourth latches 441 and 444 of the page buffer 400 coupled to the memory cell programmed to have a threshold voltage included in the threshold voltage distributions 340 and 360 is '1' and the other of data stored in the nodes N1 and N4 of the first and fourth latches 441 and 444 of the page buffer 400 coupled to the memory cell programmed to have a threshold voltage included in the threshold voltage distributions 340 and 360 is '1'.

In the state in which the first and second control signals A and B of a high level are supplied, the voltage precharged in the sense node SO is discharged in all cases except the case in which the data stored in each of the nodes N1_N and N4_N is '0' (that is, the case corresponding to the threshold voltage distribution 350 in FIG. 3A).

A voltage of the sense node SO of the page buffer 400, coupled to the memory cell programmed to have a threshold voltage included in the threshold voltage distribution 330, maintains a high level, and voltages of the sense nodes SO of the remaining page buffers 400 are shifted to a low level.

After step S605, the second reset signal RST2 of a high level is supplied at step S607.

If a voltage of the sense node SO maintains a high level, the NMOS transistor 461 is turned on, and so the node K is coupled to the ground node. In response to the second reset signal RST2 of a high level, the data stored in the node N2_N of the second latch 442 becomes '0', and the data stored in the node N2 becomes '1'.

As described above, when the step S601 was performed, data stored in the node N2_N of the second latch 442 was '1' and data stored in the node N2 thereof was '0'. If a voltage of the sense node SO maintains a high level, however, the data of the second latch 442 is changed. The page buffer 400 in which the data of the second latch 442 is changed is the page buffer 400 coupled to a memory cell programmed to have a threshold voltage included in the threshold voltage distribution 330 during the program for the fifth page. The data of the second latches 442 of the remaining page buffers 400 is not changed so that data stored in the node N2_N maintains '1', and data stored in the node N2 maintains '0'.

Next, the data stored in the first and fourth latches 441 and 444 is inverted at step S609.

An operation of inverting the data is described below.

First, in order to invert the data of the first latch 441, the voltage of the sense node SO is precharged to a high level. The first transmission signal TRANS1 of a high level is supplied.

In response to the first transmission signal TRANS1 of a high level, the NMOS transistor 431 is turned on, and the data stored in the node N1 of the first latch 441 is transferred to the sense node SO.

However, if the data of the node N1 is '0', the voltage of the sense node SO is discharged. However, if the data of the node N1 is '1', the voltage of the sense node SO maintains a high level.

The third reset signal RST3 of a high level is supplied.

In response to the third reset signal RST3 of a high level, the NMOS transistor 453a is turned on. Here, before the step S601 is started, the data of the node N3 of the third latch 443 was set to '0', and the data of the node N3_N thereof was set to '1'.

If the data of the node N1 is '0', the voltage of the sense node SO is discharged, and so the NMOS transistor 461 remains turned off. Although the NMOS transistor 453a is turned on, the data of the third latch 443 is not changed. Thus, the data of the node N3 is '0', and the data of the node N3_N is '1'.

If the data of the node N1 is '1', the voltage of the sense node SO maintains a high level. Accordingly, the NMOS transistor 461 is turned on. When the NMOS transistor 461 is turned on, the node K is coupled to the ground node.

When the NMOS transistor 453a is turned on, the data of the node N3_N becomes '0', and the data of the node N3 is changed to '1'.

After the data of the first latch 441 is moved to the third latch 443 as described above, the data of the third latch 443 is inverted and then moved to the first latch 441.

A method of inverting and moving the data is described below.

First, the sense node SO is precharged. Next, the first reset signal RST1 of a high level is supplied. In response to the first reset signal RST1 of a high level, the NMOS transistor 451a is turned on.

Since the sense node SO is precharged, the NMOS transistor 461 is turned on. Thus, the node K is coupled to the ground node. When the first reset signal RST1 is supplied, the data of the node N1 is reset to '1', and the data of the node N1_N is reset t '0'.

The sense node SO is precharged again, and the third transmission signal TRANS3 of a high level is supplied. In response to the third transmission signal TRANS3 of a high level, a voltage of the sense node SO is changed according to the data of the node N3.

When the data of the node N3 is '1', the sense node SO remains precharged, and when the data of the node N3 is '0', the sense node SO is discharged.

When the sense node SO remains precharged, the NMOS transistor 461 is turned on. When the sense node SO is discharged, the NMOS transistor 461 is turned off.

More specifically, when the data of the node N3 is '1', the node K is coupled to the ground node. When the data of the node N3 is '0', the node K is in a floating state.

Next, the first set signal SET1 of a high level is supplied. In response to the first set signal SET1 of a high level, the NMOS transistor 451b is turned on.

When the data of the node N3 is '1', the node K is coupled to the ground node. When the first set signal SET1 of a high level is supplied, the data of the node N1 is changed to '0'.

When the data of the node N3 is '0', the node K remains in the floating state. When the first set signal SET1 of a high level is supplied, the data of the node N1 maintains '1'.

Thus, the data stored in the first latch 441 is inverted.

The data of the fourth latch 444 is inverted according to the same operation as the first latch 441.

When the data is inverted, data latched in the first and fourth latches 441 and 444 become opposite to that of Table 1.

After such data inversion is performed, the sense node SO is precharged again at step S611.

The first and second control signals A and B of a high level are supplied at step S613.

In response to the first and second control signals A and B of a high level, the NMOS transistors 471a and 472a are turned on.

The NMOS transistors 471b and 472b are turned on or off according to the data of the nodes N1_N and N4_N.

At step S609, the data of the first and fourth latches 441 and 444 was inverted. Only the data of the nodes N1_N and N4_N of the page buffer 400 coupled to memory cells programmed to have threshold voltages included the threshold voltage distribution 350 in the fifth page becomes '0'. Only a voltage of the sense node SO of the page buffer 400 coupled to memory cells programmed to have threshold voltages included in the threshold voltage distribution 330 maintains a high level, and voltages of the sense nodes SO of the remaining page buffers 400 are discharged to a low level.

When the second reset signal RST2 of a high level is supplied at step S615, data stored in the node N2 of the second latch 442 of the page buffer 400 coupled to memory cells programmed to have threshold voltages included in the threshold voltage distribution 350 becomes '1', and data stored in the node N2_N thereof becomes '0'. The data of the second latches 442 of the remaining page buffers 400 remains intact.

Data stored in the node N2 of the second latch 442 of the page buffer 400 coupled to memory cells programmed to have threshold voltages included in the threshold voltage distributions 330 and 350 became '1', and data stored in the nodes N2 of the second latches 442 of the remaining page buffers 400 became '0' at steps S601 to S615.

More specifically, the data of the node N2 of the page buffer 400 to which the cell B is coupled becomes '1', and the data of the node N2 of the page buffer 400 to which the cell A is coupled becomes '0'.

The first latch 441 is set, and the fourth latch 444 is reset at step S617. More specifically, after the sense node SO is precharged, the first set signal SET1 and the fourth reset signal RST4 of a high level are supplied. In the state in which the sense node SO is precharged, when the first set signal SET1 and the fourth reset signal RST4 of a high level are supplied, data stored in the nodes N1 and N4 of the first and fourth latches 441 and 444 is changed to '0' and '1', respectively.

The data of the node N2 of the second latch 442 is transferred to the first latch 441. The data of the node N2_N of the second latch 442 is inverted and then transferred to the fourth latch 444 at steps S619 and S621.

At step S619, after the sense node SO is precharged, the second transmission signal TRANS2 of a high level is supplied.

In response to the second transmission signal TRANS2 of a high level, the NMOS transistor 432 is turned on. When the data of the node N2 is '1', the sense node SO remains precharged. When the data of the node N2 is '0', the sense node SO is discharged.

When the sense node SO remains precharged, the NMOS transistor 461 is turned on. When the NMOS transistor 461 is turned on, the node K is coupled to the ground node. Thus, when the first reset signal RST1 of a high level is supplied, the data of the node N1_N becomes '0', and the data of the node N1 becomes '1'.

When the sense node SO remains precharged, the data of the node N1 maintains '0' (that is, a reset state).

At step S621, after the sense node SO is precharged, a voltage of the sense node SO is changed by supplying the second transmission signal RST1 of a high level according to the data of the node N2.

When the data of the node N2 is '1', the sense node SO remains precharged. When the data of the node N2 is '0', the sense node SO remains discharged.

Next, the fourth set signal SET4 of a high level is supplied. When the data of the node N2 is '1', the data of the node N4 becomes '0'. When the data of the node N2 is '0', the data of the node N4 becomes '1'.

The second and third latches 442 and 443 are reset for a program operation at step S623.

If the data set operation is performed as described with reference to FIG. 6, the data of the node N1 of the page buffer 400 coupled to memory cells programmed to have threshold voltages included in the threshold voltage distributions 330 and 350 becomes '1', and the data of the node N4 thereof becomes '0'.

The data of the node N1 of the page buffer 400 coupled to memory cells programmed to have threshold voltages included in the threshold voltage distributions 340 and 360 becomes '0', and the data of the node N4 thereof becomes '1'.

The step S509 of FIG. 5 in which data for a reprogram is read after the data set operation is performed is described below.

First, the cell B is to be read by using the read voltages TREAD_A, TREAD_B, and TREAD_C, and the cell A is to be read by using the read voltages TREAD_a, TREAD_b, and TREAD_c.

The read voltages of the cell A are higher than the read voltages of the cell B.

The magnitudes of the read voltages can be compared as in Equation 1.

$$TREAD\_A < TREAD\_a < TREAD\_B < TREAD\_b < TREAD\_C < TREAD\_c \quad [Equation\ 1]$$

FIG. 7 is a flowchart illustrating a data read operation for a reprogram shown in FIG. 5.

The read operation may be divided into two operations. First, in case where data is read using the read voltages TREAD_A, TREAD_B, and TREAD_C, the data of memory cells included in the cell A is not read.

Furthermore, in case where data is read using the read voltages TREAD_a, TREAD_b, and TREAD_c, the data of memory cells included in the cell B is not read.

To this end, with respect to reading of data using read voltages TREAD_A, TREAD_B, and TREAD_C, the bit line is precharged, and an evaluation operation is performed according to a program state of a selected memory cell at step S701. The operation of the step S701 is well-known in the art, and a description thereof is omitted.

During the evaluation operation, the even bit line BLe and the sense node SO are not coupled. But after the evaluation operation, the even bit line BLe and the sense node SO are coupled to detect the data received through the even bit line BLe.

In order to sense a voltage of the bit line, the sense node SO is precharged at step S703.

In the state in which a voltage of the sense node SO is precharged to a high level, the first control signal A of a high level is supplied at step S705. In response to the first control signal A of a high level, the NMOS transistor 471a is turned on.

Next, the NMOS transistor 471b is turned on or off according to the data of the node N1_N.

The data of the node N1 of the page buffer 400 coupled to the cell A is '0', and the data of the node N1 of the page buffer 400 coupled to the cell B is '1'.

Thus, the data of the node N1_N of the page buffer 400 coupled to the cell A becomes '1', and the data of the node N1_N of the page buffer 400 coupled to the cell B becomes '0'.

The NMOS transistor 471b of the page buffer 400 coupled to the cell A is turned on, and the NMOS transistor 471b of the page buffer 400 coupled to the cell B is turned off.

Accordingly, the voltage of the sense node SO of the page buffer 400 coupled to the cell A is discharged, and the voltage of the sense node SO of the page buffer 400 coupled to the cell B remains precharged.

Next, the voltage of the bit line is sensed (for example, by applying high BSLe to NMOS transistor 413), and a sensed result is stored in the second and third latches 442 and 443 at step S707.

The steps S701 to S707 are repeated whenever read voltages are changed among the read voltages TREAD_A, TREAD_B, and TREAD_C to detect data at different threshold voltages distributions. In case where data is read using the read voltages TREAD_A, TREAD_B, and TREAD_C, the first control signal A of a high level is supplied before voltage of the bit line is sensed.

When the first control signal A of a high level is supplied as described above, a voltage of the sense node SO of the page buffer 400 coupled to the cell A maintains a high level. Accordingly, data can be stored according to a voltage of the bit line.

However, since a voltage of the sense node SO of the page buffer 400 coupled to the cell A is discharged, data cannot be stored irrespective of the voltage of the bit line.

Accordingly, the data of the cell B is not read when the data is read using the read voltages TREAD_A, TREAD_B, and TREAD_C.

A case in which data is read using the read voltages TREAD_a, TREAD_b, and TREAD_c is described below.

The bit line is precharged. An evaluation operation performed with the read voltages TREAD_a, TREAD_b, and TREAD_c being supplied at step S709 is the same as that of a well-known read operation.

Before a voltage of the bit line is sensed, the sense node SO is precharged at step S711.

After the sense node SO is precharged, the second control signal B of a high level is supplied at step S713.

In response to the second control signal B of a high level, the NMOS transistor 472a is turned on. Thus, the NMOS transistor 472b is turned on or off according to the data of the node N4_N.

Thus, the data of the node N4 of the page buffer 400 coupled to the cell A becomes '1', and the data of the node N4 of the page buffer 400 coupled to the cell B becomes '0'.

Thus, the data of the node N4_N of the page buffer 400 coupled to the cell A becomes '0', and the data of the node N4_N of the page buffer 400 coupled to the cell B becomes '1'.

The sense node SO of the page buffer 400 coupled to the cell A is discharged, and the sense node SO of the page buffer 400 coupled to the cell B remains precharged.

After the voltage of the sense node SO is changed by supplying the second control signal B of a high level, the bit line is coupled to the sense node SO and voltage of the bit line is sensed. Data according to the sensed result is stored in the second and third latches 442 and 443 at step S715.

The steps S709 to S715 are repeatedly performed using a different one of the read voltages TREAD_a, TREAD_b, and TREAD_c each time.

When data is read using the read voltages TREAD_a, TREAD_b, and TREAD_c, the sense node SO of the page buffer 400 coupled to the cell B is discharged and the voltage of the sense node SO of the page buffer 400 coupled to the cell A remains precharged. Thus, the second and third latches 442 and 443 of the page buffer 400 coupled to the cell A maintain the data stored at step S707.

In the operation of FIG. 7, the cell A and the cell B are read using different read voltages, respectively. As described above with reference to FIG. 5, a reprogram using the data read from the second and third latches 442 and 443 is performed, and program verification is performed using the verification voltages PV1, PV2, and PV3.

By performing a reprogram, the threshold voltages of memory cells influenced by the capacitive coupling when a neighboring memory cell is programmed by a reprogram operation can be corrected, and intended data can be stored, thereby obtaining appropriate reliability in storing data.

The reprogram operation described with reference to FIGS. 5 to 7 may be likewise applied to the case of FIG. 2B in which the page buffer is coupled to both bit lines of a bit line pair.

In the structure of FIG. 2B, the even bit line BLe and the odd bit line no are not distinguished. Accordingly, a reprogram for a preprogrammed page is performed after a program for the MSB page of an upper word line is performed.

In case where the $0^{th}$ to thirty-first word lines WL0 to WL31 are included, when an MSB page program for the thirty-first word line WL31 is performed, verification for the program operation is performed using the verification voltages PV1, PV2, and PV3, and a preprogram and a reprogram are performed on the remaining word lines.

In the reprogram method according to the exemplary embodiment of this disclosure, an initial MSB program for a specific page is performed as a preprogram. After the MSB program for a neighboring memory cell is performed, a voltage used to read the data of a specific page is changed according to a program state of the neighboring memory cell, a read voltage is changed, and a reprogram using the read data is then performed.

Accordingly, the degree that the threshold voltage of a memory cell is shifted can be estimated according to the degree of the capacitive coupling, and a reprogram is performed on the basis of the estimated result. Accordingly, sufficient reliability of data can be obtained.

As described above, in the semiconductor memory device and the method of operating the same according to this disclosure, in the state in which data to be programmed is stored in the page buffer, it is determined whether the threshold voltage of a memory cell on which a reprogram will be performed has shifted. The data of the memory cell is read by using a different read voltage according to a result of the determination, and a reprogram is performed using the read data. Accordingly, a memory cell can be programmed to have a sufficient read margin.

What is claimed is:

1. A semiconductor memory device, comprising:
    memory blocks having a plurality of memory cells coupled to a plurality of bit lines;
    a first latch group coupled to a sense node and configured to store data to be programmed into memory cells, wherein the memory cells are coupled to the bit lines and the sense node is coupled to at least one of the bit lines;
    a second latch group coupled to the sense node and configured to receive data of the first latch group; and
    a sense node voltage control circuit configured to control a voltage of the sense node according to data stored in the first latch group.

2. The semiconductor memory device of claim 1, wherein the first latch group comprises first and fourth latches coupled to the sense node in response to first and fourth transmiss on signals, respectively.

3. The semiconductor memory device of claim 2, wherein the second latch group comprises second and third latches coupled to the sense node in response to second and third transmission signals, respectively, and configured to store data received from the first latch group into the memory cells coupled to the bit lines.

4. The semiconductor memory device of claim 3, wherein the sense node voltage control circuit comprises:
    a first switching element for coupling the sense node and a first node in response to a first control signal;
    a second switching element for coupling the first node and a ground node according to data of the first latch;
    a third switching element for coupling the sense node and a second node in response to a second control signal; and
    a fourth switching element for coupling the second node and the ground node according to data of the fourth latch.

5. The semiconductor memory device of claim 4, further comprising a control logic circuit for outputting the first or second control signal when a data read operation is performed, wherein the control logic circuit is configured to output the first or second control signal after the sense node is precharged in the data read operation.

6. The semiconductor memory device of claim 5, wherein the control logic is configured to output the first or second control signal in the data read operation for a page selected for a reprogram.

7. A method of operating a semiconductor memory device, comprising:
    a step of performing a preprogram and verification for a most significant bit (MSB) page of a first memory cell such that a threshold voltage of the first memory cell is lower than a target voltage;
    a step of performing a program and verification on a second memory cell neighboring the first memory cell;

a read step of reading data of the MSB page of the first memory cell; and a step of performing a reprogram and verification on the first memory cell such that the threshold voltage of the first memory cells is equal to the target voltage.

8. The method of claim 7, wherein the read step comprises:

a step of detecting whether the first memory cell is in a first memory cell group and a second memory cell group according to a threshold voltage of the second memory cell;

a first read step of reading data stored in the first memory cell by using first read voltages if the first memory is in the first memory cell group; and a second read step of reading data stored in the second memory cell by using second read voltages higher than the first read voltages if the second memory is in the second memory cell group.

9. The method of claim 8, wherein:

in the first read step, data is read from the first memory cell group but not from the second memory cell group, and in the second read step, data is read from the second memory cell group but not from the first memory cell group.

10. The method of claim 7, wherein the step of performing a program and verification on the second memory cell includes performing a program on the second memory cell such that a threshold voltage of the second memory is equal to the target voltage.

11. The method of claim 7, wherein the read step includes storing data of the second memory cell and using first read voltages in reading data of the first memory cell.

12. The method of claim 11, wherein the read step includes using a page buffer to store data of the second memory cell, precharging a sense node of the page buffer and discharging, before the reading of data of the first memory, the precharged sense node depending on the stored data of the second memory cell in the page buffer.

13. A method of operating a semiconductor memory device, comprising:

a preprogram and verification step of performing a preprogram and verification for a most significant bit (MSB) page of a first memory cell such that a threshold voltage of the first memory cells is lower than a target voltage;

a program and verification step of performing a program and verification for the MSB page of a second memory cell neighboring the first memory cell;

a data read step of determining whether the first memory cell is in a first memory cell group for which data is read using a first read voltage group or a second memory cell group for which data is read using a second read voltage group in response to data programmed into the second memory cell; and a reprogram and verification step of performing a reprogram on the MSB page of the first memory cell using the read data such that the threshold voltage of the first memory cell shifts to the target voltage.

14. The method of claim 13, wherein the first and second memory cells are coupled to a same word line.

15. The method of claim 13, wherein:

after the program for the MSB page of the second memory cell is performed, a threshold voltage of the second memory cell is in one of first to fourth threshold voltage distributions, and a voltage level sequentially rises from the first threshold voltage distribution to the fourth threshold voltage distribution.

16. The method of claim 13, wherein after the program for the MSB page of the second memory cell is performed, the data stored in the second memory cell is stored in first and fourth latches of a page buffer coupled to the second memory cells via a bit line.

17. The method of claim 16, wherein the data read step comprises:

a step of determining that a location of a threshold voltage of the second memory cell with respect to first to fourth threshold voltage distributions based on the data stored in the first and fourth latches of the page buffer;

a data set step of changing the data stored in the first and fourth latches to data for distinguishing the first and second memory cell groups;

a first read step of, if, as a result of the determination, a threshold voltage of the second memory cell is determined to be within one of the first and third threshold voltage distributions, reading data of the first memory cell by using the first read voltage group and storing the read data in second and third latches of the page buffer; and a second read step of, as a result of the determination, the threshold voltages of the second memory cells are determined to be within one of the second and fourth threshold voltages, reading data of the second memory cell group by using the second read voltage group and storing the read data in the second and third latches of the page buffer.

18. The method of claim 17, wherein the data set step comprises the steps of:

if the data stored in the first latch is identical with the data stored in the fourth latch, setting the data of the second latch to '1' and if the data stored in the first latch is different from the data stored in the fourth latch, setting the data of the second latch to '0'; and transferring the data of the second latch to the first latch, inverting the data of the third latch, and transferring the inverted data to the fourth latch.

19. The method of claim 17, wherein the first read step comprises:

a bit line precharge step of precharging a bit line;

a step of blocking a connection of the bit lines and a sense node and supplying a voltage belonging to the first read voltage group to a word line, wherein the word line is coupled to the first memory cell and a pass voltage is supplied to other word lines;

a sense node precharge step of precharging the sense node;

a sense node voltage control step of maintaining or discharging a voltage of the sense node in response to the data stored in the first latch of the page buffer; and a bit line voltage sense and data storage step of coupling the bit line and the sense node, sensing a voltage of the bit line, and storing data corresponding to the sensed voltage in the second and third latches.

20. The method of claim 19, wherein the bit line precharge step, the step of blocking a connection, the sense node precharge step, the sense node voltage control step, and the bit line voltage sense and data storage step are repeatedly performed for all voltages belonging to the first read voltage group.

21. The method of claim 17, wherein the second read step comprises:

a bit line precharge step of precharging a bit line;

a step of blocking a connection of the bit lines and a sense node, supplying a voltage, belonging to the second read voltage group to a word line, wherein the word line is coupled to the first memory cell and a pass voltage is supplied to other word lines;

a sense node precharge step of precharging the sense node;

a sense node voltage control step of maintaining or discharging a voltage of the sense node in response to the data stored in the fourth latch of the page buffer; and a bit line voltage sense and data storage step of coupling the bit lines and the sense node, sensing a voltage of the bit lines, and storing data corresponding to the sensed voltage in second and third latches.

22. The method of claim 21, wherein the bit line precharge step, the step of blocking a connection, the sense node precharge step, the sense node voltage control step, and the bit line voltage sense and data storage step are repeatedly performed for all voltages belonging to the second read voltage group.

23. A method of operating a semiconductor memory device, comprising:

a first preprogram and verification step of performing a first preprogram and verification for a most significant bit (MSB) page of first memory cell such that a threshold voltage of the first memory cell shifts to a voltage lower than a target voltage;

a second preprogram and verification step of performing a second preprogram and verification for the MSB page of a second memory cell neighboring the first memory cell;

a data read step of determining that the first memory cell is in a first memory cell group for which data is to be read using a first read voltage group or a second memory cell group for which data is to be read using a second read voltage group based on data programmed into the second memory cell; and a reprogram and verification step of performing a reprogram on the MSB page of the first memory cell using the read data such that the threshold voltage of the first memory cell shifts to the target voltage.

24. The method of claim 23, wherein the first and second memory cells are coupled to a same word line.

25. The method of claim 24, wherein:

after the second preprogram and verification step, a threshold voltage of the second memory cell is included in one of first to fourth threshold voltage distributions, and a voltage level sequentially rises from the first threshold voltage distribution to the fourth threshold voltage distribution.

26. The method of claim 23, wherein after the second preprogram and verification step, the data stored in the second memory cell is stored in first and fourth latches of a page buffer coupled to the second memory cell via a bit line.

27. The method of claim 26, wherein the data read step comprises:

a step of determining that a location of a threshold voltage of the second memory cell with respect to the first to fourth threshold voltage distributions based on the data stored in the first and fourth latches of the page buffer;

a data set step of changing the data stored in the first and fourth latches to data for distinguishing the first and second memory cell groups;

a first read step of, if, as a result of the determination, a threshold voltage of the second memory cells is determined to be within one of the first and third threshold voltage distributions, reading data of the first memory cell group by using the first read voltage group and storing the read data in second and third latches of the page buffer; and a second read step of, as a result of the determination, the threshold voltages of the second memory cells are determined to be within one of the second and fourth threshold voltages, reading data of the second memory cell group by using the second read voltage group and storing the read data in the second and third latches of the page buffer.

28. The method of claim 27, wherein the data set step comprises the steps of:

if the data stored in the first latch is identical with the data stored in the fourth latch, setting the data of the second latch to '1' and if the data stored in the first latch is different from the data stored in the fourth latch, setting the data of the second latch to '0'; and transferring the data of the second latch to the first latch, inverting the data of the third latch, and transferring the inverted data to the fourth latch.

29. The method of claim 27, wherein the first read step comprises:

a bit line precharge step of precharging the bit lines;

a step of blocking a connection of the bit lines and a sense node and supplying a voltage belonging to the first read voltage group to a word line, wherein the word line is coupled to the first memory cell and a pass voltage is supplied to other word lines;

a sense node precharge step of precharging the sense node;

a sense node voltage control step of maintaining or discharging a voltage of the sense node in response to the data stored in the first latch of the page buffer; and a bit line voltage sense and data storage step of coupling the bit lines and the sense node, sensing a voltage of the bit line, and storing data corresponding to the sensed voltage in the second and third latches.

30. The method of claim 29, wherein the bit line precharge step, the step of blocking a connection, the sense node precharge step, the sense node voltage control step, and the bit line voltage sense and data storage step are repeatedly performed for all voltages belonging to the first read voltage group.

31. The method of claim 27, wherein the second read step comprises:

a bit line precharge step of precharging the bit lines;

a step of blocking a connection of the bit lines and a sense node supplying a voltage belonging to the second read voltage group to a word line, wherein the word line is coupled to the first memory cell and a pass voltage is supplied to other word lines;

a sense node precharge step of precharging the sense node;

a sense node voltage control step of maintaining or discharging a voltage of the sense node in response to the data stored in the fourth latch of the page buffer; and a bit line voltage sense and data storage step of coupling the bit lines and the sense node, sensing a voltage of the bit lines, and storing data corresponding to the sensed voltage in the second and third latches.

32. The method of claim 31, wherein the bit line precharge step, the step of blocking a connection, the sense node precharge step, the sense node voltage control step, and the bit line voltage sense and data storage step are repeatedly performed for all voltages belonging to the second read voltage group.

33. The method of claim 23, further comprising, after the reprogram and verification step:

a third preprogram and verification step of performing a preprogram for the MSB page of a third memory cell, and performing verification for the preprogram using a first verification voltage group;

a data read step of determining that the second memory cell is in the first memory cell group or the second memory cell group based on data stored in the third memory cell; and a step of performing a reprogram for the MSB page of the second memory cell using the read data and verifying the reprogram using a second verification voltage group.

* * * * *